(12) United States Patent
Takamiya et al.

(10) Patent No.: US 9,111,837 B2
(45) Date of Patent: Aug. 18, 2015

(54) IMAGE SENSOR

(75) Inventors: Kenichi Takamiya, Fukuoka (JP); Ken Koseki, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 125 days.

(21) Appl. No.: 12/676,092

(22) PCT Filed: Sep. 10, 2008

(86) PCT No.: PCT/JP2008/066281
§ 371 (c)(1),
(2), (4) Date: Mar. 2, 2010

(87) PCT Pub. No.: WO2009/034978
PCT Pub. Date: Mar. 19, 2009

(65) Prior Publication Data
US 2010/0182469 A1   Jul. 22, 2010

(30) Foreign Application Priority Data
Sep. 10, 2007  (JP) .................................. 2007-233662

(51) Int. Cl.
*H01L 27/146* (2006.01)
*H04N 5/345* (2011.01)
(Continued)

(52) U.S. Cl.
CPC .... *H01L 27/14654* (2013.01); *H01L 27/14641* (2013.01); *H04N 5/345* (2013.01);
(Continued)

(58) Field of Classification Search
CPC ........ H04N 5/30; H04N 5/3591; H01L 27/14; H01L 7/14887
USPC ........ 348/222.1, 229.1–230.1, 241, 248–250, 348/294–299, 302–306, 311–324; 250/208.1
See application file for complete search history.

(56) References Cited

U.S. PATENT DOCUMENTS

2002/0051229 A1* 5/2002 Eguchi et al. ................. 358/445
2002/0154236 A1* 10/2002 Sakurai et al. ................ 348/312
(Continued)

FOREIGN PATENT DOCUMENTS

EP      1 353 499 A1    10/2003
JP      08-195908       7/1996
(Continued)

OTHER PUBLICATIONS

European Search Report dated Dec. 13, 2011 in connection with counterpart EP Application No. 08 83 0176.
(Continued)

*Primary Examiner* — Michael Osinski
(74) *Attorney, Agent, or Firm* — Dentons US LLP

(57) ABSTRACT

The present invention relates to an image sensor capable of obtaining a good-quality image with a simple configuration. A pixel accumulates a charge by performing photoelectric conversion on incident light, and outputs a pixel signal corresponding to the charge. A vertical scanning circuit controls the pixel to cause the pixel to perform a shutter process of discharging an unnecessary charge accumulated in the pixel, a charge accumulation process of accumulating a charge generated through photoelectric conversion in a predetermined exposure time in the pixel, and a read process of outputting a pixel signal corresponding to the charge accumulated in the pixel in the charge accumulation process. Also, the control means causes the charge generated through photoelectric conversion in the pixel to be discharged in a non-accumulation period, which is a period other than a period when the shutter process is being performed, a period when the charge accumulation process is being performed, and a period when the read process is being performed. The present invention can be applied to a CMOS sensor, for example.

6 Claims, 16 Drawing Sheets

(51) Int. Cl.
*H04N 5/353* (2011.01)
*H04N 5/359* (2011.01)
*H04N 5/374* (2011.01)
*H04N 5/3745* (2011.01)
*H04N 5/376* (2011.01)

(52) U.S. Cl.
CPC ............ *H04N 5/353* (2013.01); *H04N 5/3594* (2013.01); *H04N 5/376* (2013.01); *H04N 5/3742* (2013.01); *H04N 5/37457* (2013.01)

(56) References Cited

U.S. PATENT DOCUMENTS

| | | | |
|---|---|---|---|
| 2004/0021058 | A1 | 2/2004 | Drowley et al. |
| 2004/0096124 | A1 | 5/2004 | Nakamura |
| 2005/0110884 | A1* | 5/2005 | Altice et al. ............ 348/302 |
| 2005/0128324 | A1* | 6/2005 | Kishi et al. ............ 348/294 |
| 2005/0128327 | A1* | 6/2005 | Bencuya et al. ............ 348/308 |
| 2005/0151866 | A1* | 7/2005 | Ando et al. ............ 348/297 |
| 2005/0167571 | A1* | 8/2005 | Altice et al. ............ 250/208.1 |
| 2006/0102827 | A1* | 5/2006 | Kasuga et al. ............ 250/208.1 |
| 2006/0232580 | A1* | 10/2006 | Koyama ............ 345/211 |
| 2007/0023798 | A1* | 2/2007 | McKee ............ 257/291 |
| 2007/0035649 | A1* | 2/2007 | McKee ............ 348/308 |
| 2007/0126902 | A1 | 6/2007 | Kuroda |
| 2007/0165128 | A1* | 7/2007 | Kato ............ 348/311 |

FOREIGN PATENT DOCUMENTS

| | | |
|---|---|---|
| JP | HEI 09-046596 | 2/1997 |
| JP | HEI 09-051485 | 2/1997 |
| JP | 09-312806 | 12/1997 |
| JP | 2000-350103 | 12/2000 |
| JP | A 2000-350103 | 12/2000 |
| JP | A 2004-048813 | 2/2004 |
| JP | 2004-166269 | 6/2004 |
| JP | A 2004-166269 | 6/2004 |
| JP | A 2005-065184 | 3/2005 |
| JP | 2006-340090 | 12/2006 |
| JP | 2007-158740 | 6/2007 |
| JP | 2007-158741 | 6/2007 |
| KR | 10-2004-0034517 | 4/2004 |
| WO | 2006/073875 | 7/2006 |

OTHER PUBLICATIONS

International Search Report Dated December 16, 2008.
Communication Pursuant to Article 94(3) EPC dated Aug. 1, 2012 in connection with counterpart EP Application No. 08 83 0176.
European Patent Office, Office Action dated May 14, 2013; Application No. 08 830 176.7-1902.
Japanese Patent Office; Office Action for Serial No. 2013-043913; Oct. 8, 2013.
Korean Office Examination issued in connection with related Korean Patent Application No. 10-2010-7004792 dated Jun. 16, 2014.

* cited by examiner

IMAGE SENSOR

TECHNICAL FIELD

The present invention relates to image sensors, and specifically relates to an image sensor capable of obtaining a good-quality image with a simple configuration.

BACKGROUND ART

Generally, in a CMOS (complementary metal oxide semiconductor) sensor, a plurality of pixels having photodiodes are arranged in a matrix pattern, and pixel signals corresponding to charges generated through photoelectric conversion performed by the photodiodes are output from the respective pixels.

Also, the respective pixels of the CMOS sensor have transistors for controlling the output of pixel signals, and pixel signals are output in units of lines (rows) or in units of pixels in response to control signals that specify addresses of rows and columns.

For example, each pixel is configured including four transistors: a transfer transistor; a reset transistor; an amplifying transistor; and a selection transistor. Also, a node connecting the transfer transistor, the reset transistor, and the amplifying transistor constitutes a floating diffusion that accumulates a charge generated through photoelectric conversion performed by the photodiode and that converts the charge into a voltage.

The transfer transistor transfers the charge generated through photoelectric conversion performed by the photodiode to the floating diffusion. The reset transistor resets the charge accumulated in the floating diffusion. The amplifying transistor amplifies the voltage according to the charge accumulated in the floating diffusion. The selection transistor outputs the voltage amplified by the amplifying transistor, that is, a pixel signal, to a vertical signal line.

That is, in the CMOS sensor, the respective transistors are controlled, whereby a process of transferring a charge accumulated in the photodiode to the floating diffusion and a process of outputting a pixel signal are performed in units of rows or in units of pixels. Also, in the CMOS sensor, a process of resetting the charge previously accumulated in a photodiode at the start of exposure of a pixel and resetting the charge accumulated in a photodiode and a floating diffusion due to exposure at the end of exposure of a pixel (hereinafter called rolling shutter as necessary) is performed.

Also, in the CMOS sensor, a process of cropping the angle of view or a thinning process is performed to capture an image in which the number of pixels is smaller than the total number of pixels. For example, in a thinning process, the pixels from which pixel signals are read are thinned down at the intervals of several rows and several columns, so that an image is captured using pixel signals read from some of the pixels.

In such a thinning process or the like, there are pixels from which pixel signals are not read, and a rolling shutter for controlling the starting and ending of accumulation of a charge is not applied to those non-read pixels, which are pixels from which pixel signals are not read, so that a blooming phenomenon occurs. The blooming phenomenon is a phenomenon in which, when a charge is generated through photoelectric conversion beyond the maximum amount of charge the photodiode can accumulate, the charge overflows (leaks) from the photodiode and passes through a transfer transistor and a channel-stop region, so as to flow into a floating diffusion or another adjoining pixel.

When the blooming phenomenon occurs, a white zonal or white circular pattern appears in an image, which may degrade image quality.

As measures against the blooming phenomenon, it is applicable to provide, on pixels from which pixel signals are not read, a shutter for resetting a charge accumulated in the photodiode and avoiding the blooming phenomenon.

However, in order to provide a shutter for avoiding the blooming phenomenon, a circuit and an address line dedicated to performing the process need to be added to the CMOS sensor. In order to deal with various imaging modes, a process of cropping the angle of view or a thinning process corresponding to the respective imaging modes needs to be handled, and thus the dedicated circuit for providing a shutter for avoiding the blooming phenomenon becomes complicated and the circuit scale thereof increases.

Furthermore, this dedicated circuit is dedicated to a specific imaging mode, and the circuit needs to be modified or a circuit needs to be newly added when the imaging mode is modified or another imaging mode is added, so that it is difficult to respond to modification or addition of an imaging mode. Also, in a case of preparing a dedicated address line, many address lines are required and a dedicated address decoding circuit is also required. For this reason, in a case where many imaging modes exist, a method for combining address lines for a shutter for avoiding the blooming phenomenon and a dedicated circuit is used. However, the circuit becomes complicated and the circuit scale thereof increases. Also, in an address control device that manages shutter positions, the number of shutter positions required to be managed increases and complexity occurs, and as a result, the circuit scale of the address control device increases.

Also, in pixels from which pixel signals are read, if intense light enters a photodiode before a rolling shutter is applied, a charge overflows from the photodiode and the blooming phenomenon occurs. Also, in a case where an adjoining pixel is being exposed, an unnecessary charge is accumulated in the pixel, which degrades image quality.

Here, there is disclosed a technique of performing time division multiplexing on an address selected by a decoder and selecting a plurality of electronic shutter rows or read rows using one decoder (for example, see Patent Document 1).

Patent Document 1: Japanese Unexamined Patent Application publication No. 2004-166269

DISCLOSURE OF INVENTION

Technical Problem

As described above, in the conventional CMOS sensor, a circuit having a complicated configuration needs to be used to avoid a blooming phenomenon and obtain a good-quality image without degradation of image quality due to the blooming phenomenon.

The present invention has been made in view of these circumstances and is directed to obtaining a good-quality image with a simple configuration.

Technical Solution

An image sensor according to an aspect of the present invention is an image sensor configured to capture an image. The image sensor includes a pixel configured to accumulate a charge by performing photoelectric conversion on incident light and output a pixel signal corresponding to the charge, and control means for controlling the pixel to cause the pixel to perform a shutter process of discharging an unnecessary charge accumulated in the pixel, a charge accumulation process of accumulating a charge generated through photoelectric conversion in a predetermined exposure time in the pixel, and a read process of outputting a pixel signal corresponding to the charge accumulated in the pixel in the charge accumulation process. The control means causes the charge generated through photoelectric conversion in the pixel to be discharged in a non-accumulation period, which is a period other than a period when the shutter process is being performed, a period when the charge accumulation process is being performed, and a period when the read process is being performed.

In an aspect of the present invention, a charge is accumulated through photoelectric conversion on incident light and a pixel signal corresponding to the charge is output by a pixel. The pixel is controlled by control means, whereby a shutter process of discharging an unnecessary charge accumulated in the pixel, a charge accumulation process of accumulating a charge generated through photoelectric conversion in a predetermined exposure time in the pixel, and a read process of outputting a pixel signal corresponding to the charge accumulated in the pixel in the charge accumulation process are performed. Also, the control means causes the charge generated through photoelectric conversion in the pixel to be discharged in a non-accumulation period, which is a period other than a period when the shutter process is being performed, a period when the charge accumulation process is being performed, and a period when the read process is being performed.

Advantageous Effects

According to an aspect of the present invention, a good-quality image can be obtained with a simple configuration.

EXPLANATION OF REFERENCE NUMERALS

11 CMOS sensor, 12 system control unit, 13 vertical scanning circuit, 14 pixel array, 15 reference voltage circuit, 16 column ADC, 17 horizontal scanning circuit, $21_{11}$ to $21_{MN}$ pixel, $22_1$ to $22_N$ row control line, $23_1$ to $23_M$ vertical signal line, 25 voltage comparing unit, 26 A/D converting unit, 27 sensitivity amplifying unit, $28_1$ to $28_M$ comparator, $29_1$ to $29_M$ A/D converter, 31 photodiode, 32 transfer transistor, 33 reset transistor, 34 amplifying transistor, 35 selection transistor, 36 floating diffusion, 41 timing control circuit, 42 drive circuit, 43 output control circuit.

Best Modes For Carrying Out The Invention

Hereinafter, a specific embodiment to which the present invention is applied will be described in detail with reference to the drawings.

Figure 1:
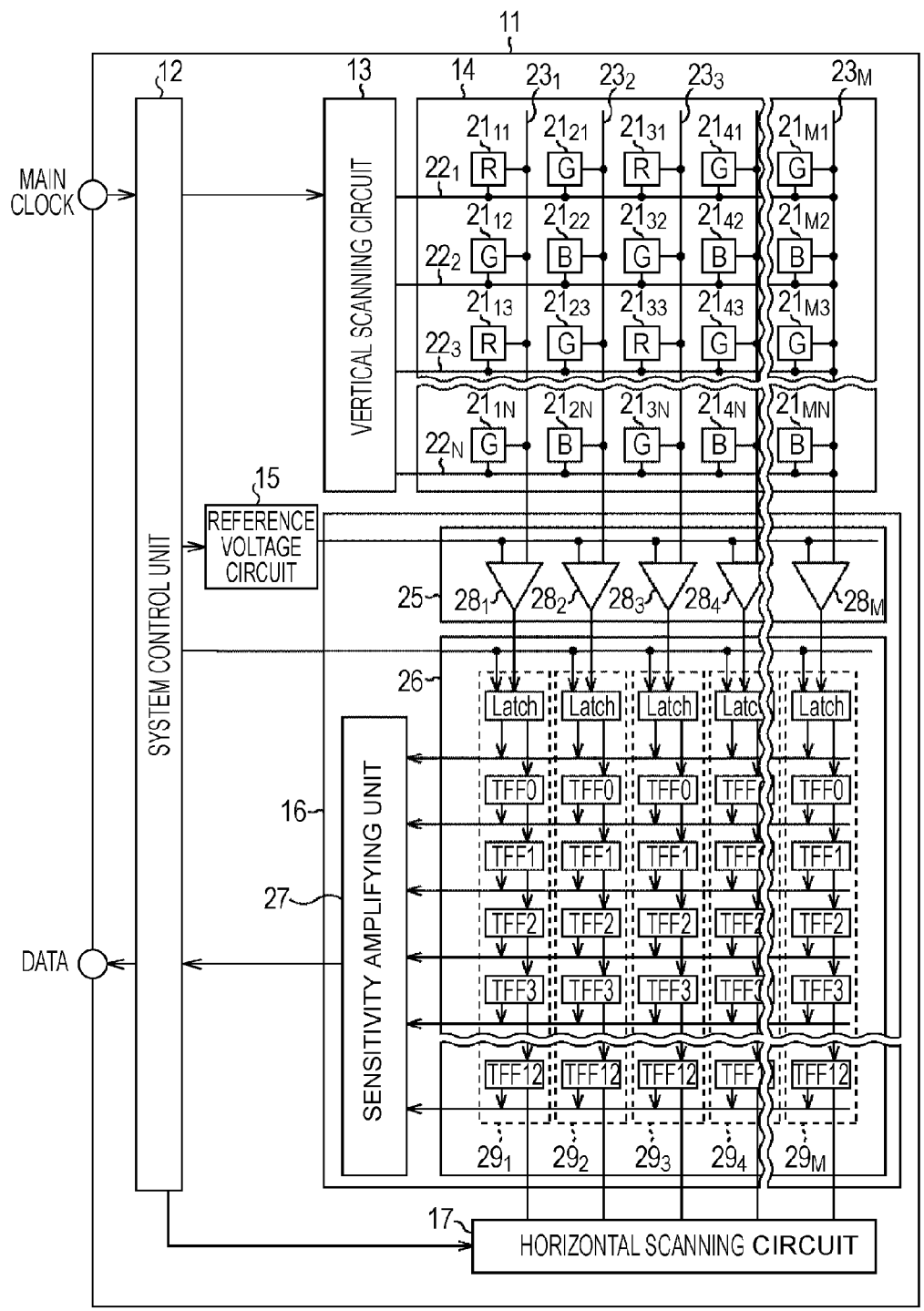
FIG. 1 is a block diagram illustrating a configuration example of an embodiment of a CMOS sensor to which the present invention is applied.

FIG. 1 is a block diagram illustrating a configuration example of an embodiment of a CMOS sensor to which the present invention is applied.

In FIG. 1, a CMOS sensor 11 is configured including a system control unit 12, a vertical scanning circuit 13, a pixel array 14, a reference voltage circuit 15, a column ADC (Analog to Digital Converter) 16, and a horizontal scanning circuit 17.

The system control unit 12 includes a logic control circuit, a PLL circuit (CLK frequency dividing), a timing control circuit, a communication interface, etc. A main clock is supplied to the system control unit 12 from an external circuit that is not illustrated, and the system control circuit 12 performs control of respective blocks constituting the CMOS sensor 11 and communication with the external circuit.

The vertical scanning circuit 13 sequentially controls pixels arranged in the vertical direction in the pixel array 14 at predetermined timing in accordance with control by the system control unit 12, thereby causing pixel signals to be output from the respective pixels.

The pixel array 14 is configured including pixels $21_{11}$ to $21_{MN}$ the horizontal×vertical number of which is M×N, row control lines $22_1$ to $22_N$ the number of which is N, and vertical signal lines $23_1$ to $23_M$ the number of which is M. The pixels $21_{11}$ to $21_{MN}$ are connected to the vertical scanning circuit 13 via the row control lines $22_1$ to $22_N$ and are connected to the column ADC 16 via the vertical signal lines $23_1$ to $23_M$.

The pixels $21_{11}$ to $21_{MN}$ are arranged in a Bayer pattern so as to receive light of three colors (R, G, and B), are driven in response to drive signals supplied from the vertical scanning circuit 13 via the row control lines $22_1$ to $22_N$, and output pixel signals to the vertical signal lines $23_1$ to $23_M$.

A control signal for controlling gain or offset, a clock signal of a predetermined frequency, and the like are supplied to the reference voltage circuit 15 from the system control unit 12. The reference voltage circuit 15 generates a ramp signal in which the voltage drops with a certain slope from a predetermined initial voltage and supplies the signal to the column ADC 16.

The column ADC 16 is configured including a voltage comparing unit 25, an A/D converting unit 26, and a sensitivity amplifying unit 27.

The voltage comparing unit 25 includes comparators $28_1$ to $28_M$ the number of which is M. Pixel signals are supplied to the comparators $28_1$ to $28_M$ from the pixels $21_{11}$ to $21_{MN}$ via the vertical signal lines $23_1$ to $23_M$, respectively, and a ramp signal is supplied to the comparators $28_1$ to $28_M$ from the reference voltage circuit 15.

The comparators $28_1$ to $28_M$ compare the pixel signals supplied via the vertical signal lines $23_1$ to $23_M$ with the ramp signal supplied from the reference voltage circuit 15 and supply comparison result signals indicating the comparison result to the A/D converting unit 26.

That is, the comparator $28_1$ compares the pixel signals that are sequentially supplied from the pixels $21_{11}$ to $21_{1N}$ in the first column via the vertical signal line $23_1$ with the ramp signal supplied from the reference voltage circuit 15, and supplies a comparison result signal obtained as a result of the comparison to an A/D converter $29_1$ of the A/D converting unit 26.

Like the comparator $28_1$, the comparator $28_2$ supplies a comparison result signal obtained as a result of comparing the pixel signals of the pixels $21_{21}$ to $21_{2N}$ in the second column with the ramp signal to an A/D converter $29_2$ of the A/D converting unit 26. Hereinafter, likewise, the comparator $28_M$ supplies a comparison result signal obtained as a result of comparing the pixel signals of the pixels $21_{M1}$ to $21_{MN}$ in the M-th column with the ramp signal to an A/D converter $29_M$ of the A/D converting unit 26.

The A/D converting unit 26 includes the A/D converters $29_1$ to $29_M$ the number of which is M, and comparison result signals are supplied to the A/D converters $29_1$ to $29_M$ from the comparators $28_1$ to $28_M$ of the voltage comparing unit 25, respectively.

Each of the A/D converters $29_1$ to $29_M$ is configured including a latch and thirteen TFFs (Toggle Flip-Flops) and outputs thirteen-bit pixel data.

That is, comparison result signals are supplied to the A/D converters $29_1$ to $29_M$ from the comparators $28_1$ to $28_M$, and also counter clock signals of a predetermined frequency and predetermined control signals are supplied to the A/D converters $29_1$ to $29_M$ from the system control unit 12. Also, the A/D converters $29_1$ to $29_M$ count the counter clock signals supplied from the system control unit 12 in accordance with the comparison result signals supplied from the comparators $28_1$ to $28_M$ and the control signals supplied from the system control unit 12, thereby A/D-converting analog pixel signals output from the pixels $21_{11}$ to $21_{MN}$ of the pixel array 14 and outputting pixel data obtained as a result.

The sensitivity amplifying unit 27 amplifies the pixel data output from the A/D converting unit 26 and outputs the pixel data to an image processing circuit or the like in the subsequent stage via the system control unit 12.

The horizontal scanning circuit 17 sequentially controls the plurality of A/D converters $29_1$ to $29_M$ arranged in the horizontal direction of the column ADC 16 at predetermined timing in accordance with a control signal supplied from the system control unit 12 to output pixel data.

Figure 2:
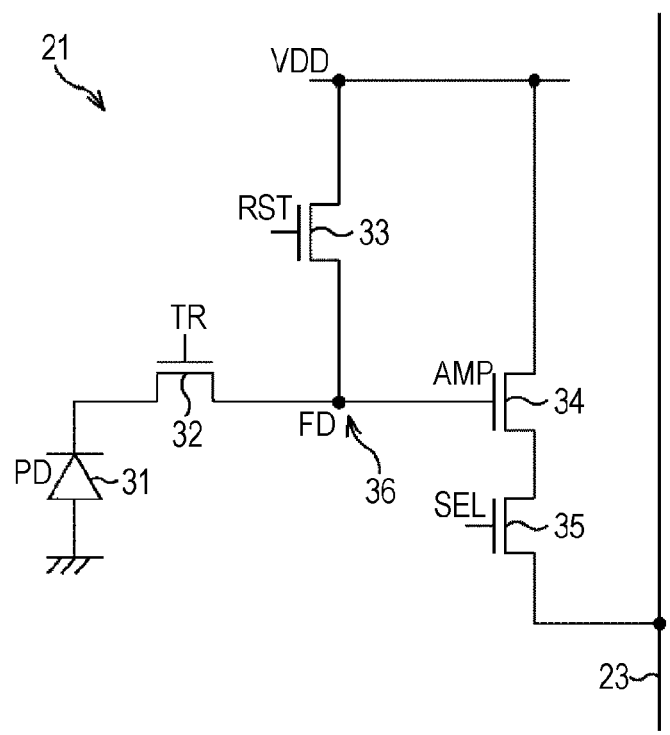
FIG. 2 is a circuit diagram illustrating a configuration example of a pixel 21.

Next, FIG. 2 is a circuit diagram illustrating a configuration example of the pixel 21 in FIG. 1.

In FIG. 2, the pixel 21 is configured including a photodiode (PD) 31, a transfer transistor (TR) 32, a reset transistor (RST) 33, an amplifying transistor (AMP) 34, a selection transistor (SEL) 35, and a floating diffusion (FD) 36.

The anode of the photodiode 31 is grounded, and the cathode of the photodiode 31 is connected to the source of the transfer transistor 32. The drain of the transfer transistor 32 is connected to the drain of the reset transistor 33 and the gate of the amplifying transistor 34, and the node thereof constitutes the floating diffusion 36.

The source of the reset transistor 33 and the source of the amplifying transistor 34 are connected to a predetermined power supply voltage VDD. The drain of the amplifying transistor 34 is connected to the source of the selection transistor 35, and the drain of the selection transistor 35 is connected to the vertical signal line 23.

The gate of the transfer transistor 32, the gate of the reset transistor 33, and the gate of the selection transistor 35 are connected to the vertical scanning circuit 13 via the row control line 22 in FIG. 1, and drive signals are supplied thereto from the vertical scanning circuit 13.

The photodiode 31 performs photoelectric conversion on incident light, and generates and accumulates a charge corresponding to the amount of light.

The transfer transistor 32 turns on/off transfer of a charge from the photodiode 31 to the floating diffusion 36 in accordance with a drive signal TR_OUT supplied from the vertical scanning circuit 13. For example, the transfer transistor 32 transfers the charge accumulated in the photodiode 31 to the floating diffusion 36 when being supplied with an H-level drive signal TR_OUT, and stops transferring the charge when being supplied with an L-level drive signal TR_OUT. Also, while the transfer transistor 32 stops transferring a charge to the floating diffusion 36, the charge generated through photoelectric conversion performed by the photodiode 31 is accumulated in the photodiode 31.

The reset transistor 33 turns on/off discharge of a charge accumulated in the floating diffusion 36 in accordance with a drive signal RST_OUT supplied from the vertical scanning circuit 13. For example, when being supplied with an H-level drive signal RST_OUT, the reset transistor 33 clamps the floating diffusion 36 to the power supply voltage VDD and discharges (resets) the charge accumulated in the floating diffusion 36. Also, when being supplied with an L-level drive signal RST_OUT, the reset transistor 33 causes the floating diffusion 36 to be in an electrically-floating state.

The amplifying transistor 34 amplifies a voltage according to the charge accumulated in the floating diffusion 36. The voltage amplified by the amplifying transistor 34 is output as a pixel signal via the selection transistor 35.

The selection transistor 35 turns on/off output of a pixel signal from the amplifying transistor 34 to the vertical signal line 23 in accordance with a drive signal SEL_OUT supplied from the vertical scanning circuit 13. For example, the selection transistor 35 outputs a pixel signal to the vertical signal line 23 when being supplied with an H-level drive signal SEL_OUT, and stops output of a pixel signal when being supplied with an L-level drive signal SEL_OUT.

The floating diffusion 36 accumulates a charge transferred from the photodiode 31 via the transfer transistor 32 and converts the charge into a voltage.

In this way, the pixel 21 is driven in accordance with the drive signal TR_OUT, the drive signal RST_OUT, and the drive signal SEL_OUT supplied from the vertical scanning circuit 13.

Next, a drive timing of the pixel 21 will be described. Before describing a drive timing in the CMOS sensor 11 to which the present invention is applied, a drive timing in a conventional CMOS sensor will be described.

Note that the blocks in the conventional CMOS sensor are common to those in the CMOS sensor 11 in FIG. 1 except the vertical scanning circuit 13 of the CMOS sensor 11. Hereinafter, the blocks common to those in the CMOS sensor 11 will be described with the same reference numerals.

Figure 3:
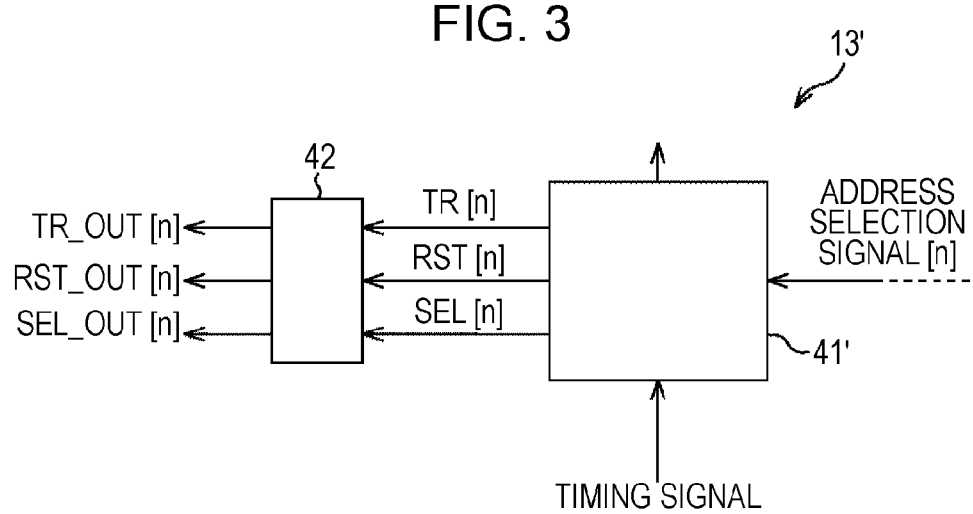
FIG. 3 is a block diagram illustrating a configuration example of a vertical scanning circuit of a conventional CMOS sensor.

FIG. 3 is a block diagram illustrating a configuration example of a vertical scanning circuit of the conventional CMOS sensor.

In FIG. 3, the vertical scanning circuit 13' is configured including timing control circuits 41' and drive circuits 42.

Specifically, in the vertical scanning circuit 13', a timing control circuit 41' and a drive circuit 42 are provided for each row of the pixels 21. In the example in FIG. 3, the timing control circuit 41' and the drive circuit 42 for the n-th row are illustrated. Note that, hereinafter, the pixels $21_{1N}$ to $21_{MN}$ in the n-th row are called pixels 21n as necessary.

A timing signal for getting the timing of driving the transfer transistors 32, the reset transistors 33, and the selection transistors 35 of the pixels 21n is supplied to the timing control circuit 41' from the system control unit 12. Note that the timing signal is used in common in the timing control circuits 41' for the respective rows. For example, a timing signal is supplied to the timing control circuit 41' for the n-th row via the timing control circuit 41' for the n−1-th row, and the timing control circuit 41' for the n-th row supplies the timing signal to the timing control circuit 41' for the n+1-th row.

Also, an address selection signal [n] indicating whether the pixels 21n are selected as pixels that output pixel signals is supplied to the timing control circuit 41' from the system control unit 12.

When being supplied with an address selection signal [n] indicating that the pixels 21n are selected as pixels that output pixel signals from the system control unit 12, the timing control circuit 41' generates drive timing signals in accordance with a timing signal and supplies the drive timing signals to the drive circuit 42. That is, the timing control circuit 41' generates a drive timing signal TR[n] indicating the drive timing of the transfer transistors 32, a drive timing signal RST[n] indicating the drive timing of the reset transistors 33, and a drive timing signal SEL[n] indicating the drive timing of the selection transistors 35.

The drive circuit 42 generates a drive signal TR_OUT[n] for driving the transfer transistors 32 in accordance with the drive timing signal TR[n] supplied from the timing control circuit 41' and supplies the signal to the pixels 21n. Also, the drive circuit 42 generates a drive signal RST_OUT[n] for driving the reset transistors 33 in accordance with the drive timing signal RST[n] supplied from the timing control circuit 41' and supplies the signal to the pixels 21n. Also, the drive circuit 42 generates a drive signal SEL_OUT[n] for driving the selection transistors 35 in accordance with the drive timing signal SEL[n] supplied from the timing control circuit 41' and supplies the signal to the pixels 21n.

Figure 4:
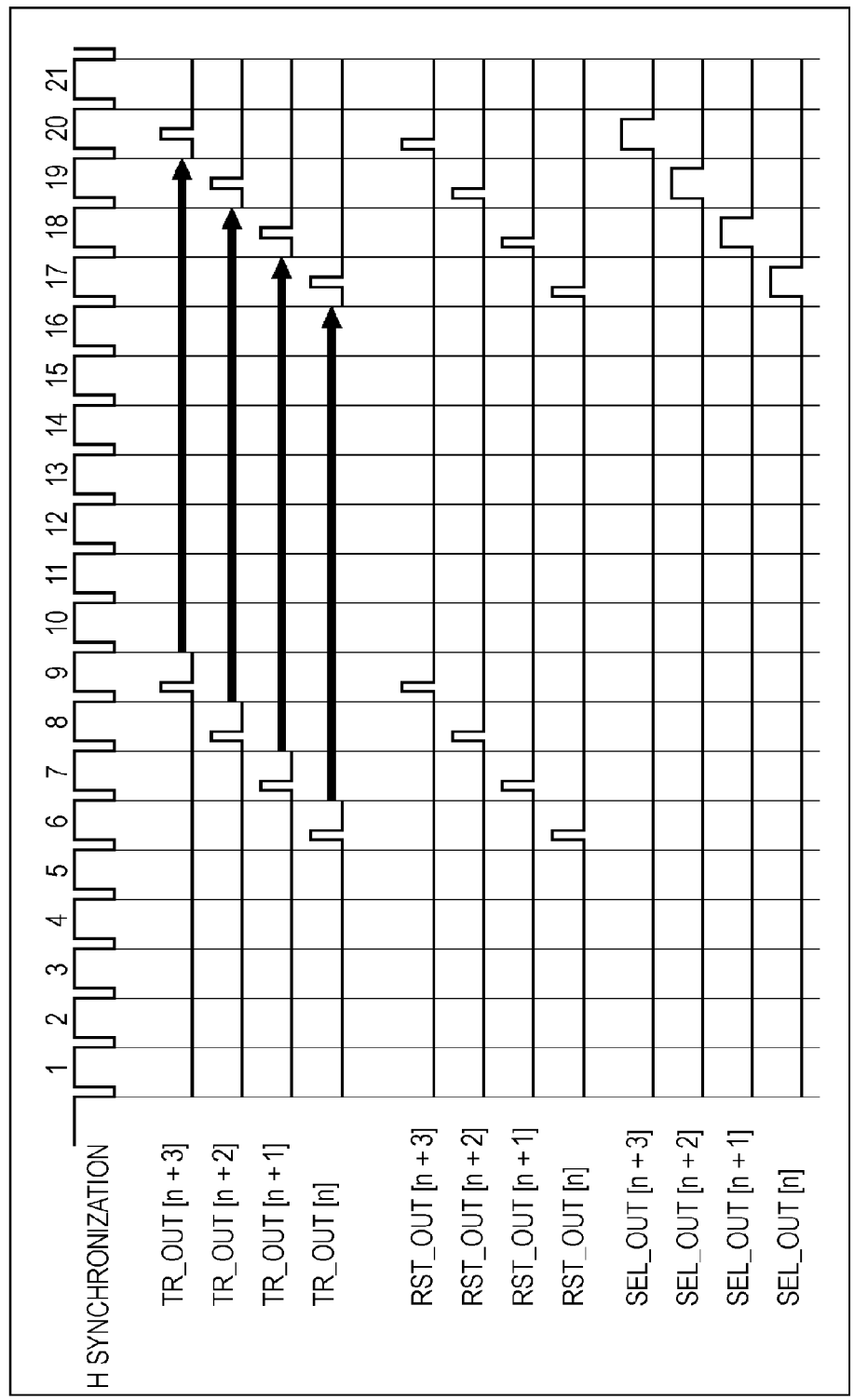
FIG. 4 is a timing chart explaining respective signals supplied to pixels 21 in the conventional CMOS sensor.

Next, FIG. 4 is a timing chart explaining respective signals supplied to the pixels 21 in the conventional CMOS sensor. With reference to FIG. 4, a description will be given about pixels in four rows: pixels 21n in the n-th row to pixels 21n+3 in the n+3 -th row.

At the top of FIG. 4, an H synchronization signal that is used for synchronization in a horizontal scanning period is illustrated. In FIG. 4, the first horizontal scanning period 1H to the twenty-first horizontal scanning period 21H are illustrated.

Under the H synchronization signal, drive signals TR_OUT to TR_OUT[n+3 ], drive signals RST_OUT [n] to RST_OUT[n+3], and drive signals SEL_OUT[n] to SEL_OUT[n+3] supplied to the pixels 21n to 21n+3 are illustrated in order from the top.

As illustrated in FIG. 4, the drive signal TR_OUT[n] and the drive signal RST_OUT[n] supplied to the pixels 21n increase in a pulse-like manner to an H-level in the horizontal scanning period 6H, so that the transfer transistors 32 and the reset transistors 33 of the pixels 21n are simultaneously turned on. Accordingly, in the pixels 21n, the charges accumulated in the photodiodes 31 by the horizontal scanning period 5H are discharged. Hereinafter, such a process of discharging the charges accumulated in the photodiodes 31 is called a shutter process as necessary.

After that, the drive signal TR_OUT[n] supplied to the pixels 21n is at an L-level in the horizontal scanning periods 7H to 16H, whereby charges generated through photoelectric conversion according to the amount of received light are accumulated in the photodiodes 31. Also, in the horizontal scanning periods 7H to 16H, the drive signal RST_OUT[n] is also at the L-level. Here, the time of the horizontal scanning periods 7H to 16H is an exposure time when the pixels 21n are exposed, and the arrow drawn in the horizontal scanning periods 7H to 16H of the drive signal TR_OUT[n] indicates the exposure time of the pixels 21n. Hereinafter, such a process of accumulating charges in the photodiodes 31 is called a charge accumulation process as necessary.

Then, after the drive signal RST_OUT[n] increases in a pulse-like manner to the H-level in the horizontal scanning period 17H, the drive signal TR_OUT[n] increases in a pulse-like manner to the H-level. During the time when the drive signal RST_OUT[n] and the drive signal TR_OUT[n] are at the H-level in a pulse-like manner, the drive signal SEL_OUT [n] is at the H-level. Accordingly, pixel signals of the pixels 21n are output to the vertical signal lines 23. Hereinafter, such a process of outputting the pixel signals of the pixels 21n to the vertical signal lines 23 is called a read process as necessary.

Note that each of the pixel signals of the pixels 21n is composed of a signal corresponding to the voltage of a reset level and a signal corresponding to the charge transferred from the photodiode 31 to the floating diffusion 36. That is, the drive signal RST_OUT[n] increases in a pulse-like manner to the H-level and the reset transistors 33 of the pixels 21n are turned on, whereby the floating diffusions 36 are reset and signals corresponding to the voltage of the reset level (that is, the power supply voltage VDD) are output. After that, the drive signal TR_OUT[n] increases in a pulse-like manner to the H-level and the transfer transistors 32 of the pixels 21n are turned on, whereby the charges generated through photoelectric conversion performed by the photodiodes 31 in an exposure time are transferred to the floating diffusions 36 and are converted to voltages, and signals corresponding to the charges are output.

Also, like the pixels 21n, the pixels 21n+1 are driven in accordance with the drive signal TR_OUT[n+1], the drive signal RST_OUT[n+1], and the drive signal SEL_OUT[n+ 1], perform a shutter process in the horizontal scanning period 7H, perform a charge accumulation process in the horizontal scanning periods 8H to 17H, and perform a read process in the horizontal scanning period 18H. Hereinafter, likewise, the pixels 21n+2 perform a shutter process in the horizontal scanning period 8H, perform a charge accumulation process in the horizontal scanning periods 9H to 18H, and perform a read process in the horizontal scanning period 19H. Also, the pixels 21n+3 perform a shutter process in the horizontal scanning period 9H, perform a charge accumulation process in the horizontal scanning periods 10H to 19H, and perform a read process in the horizontal scanning period 20H.

Note that the exposure time needs to be the same in each row, and is the time corresponding to the horizontal scanning period 10H in the example in FIG. 4. Additionally, this exposure time can be set to an arbitrary time in accordance with the brightness or the like of a subject.

In this way, the pixels 21 are driven in accordance with the drive signals output from the vertical scanning circuit 13'. Also, for example, assume that intense light enters the photodiodes 31 in the horizontal scanning period other than the horizontal scanning period when a shutter process is being preformed, the horizontal scanning period when a charge accumulation process is being performed, and the horizontal scanning period when a read process is being performed (hereinafter called non-accumulation period as necessary). At this time, if the photodiodes 31 perform photoelectric conversion to generate charges the amount of which is equal to or larger than the maximum amount of charge the photodiodes 31 can accumulate, the charges overflow from the photodiodes 31 and a blooming phenomenon occurs.

Then, measures are taken to prevent the occurrence of such a blooming phenomenon.

Here, the horizontal scanning period other than the horizontal scanning period when a shutter process is being preformed, the horizontal scanning period when a charge accumulation process is being performed, and the horizontal scanning period when a read process is being performed is hereinafter called a non-accumulation period as necessary.

Figure 5:
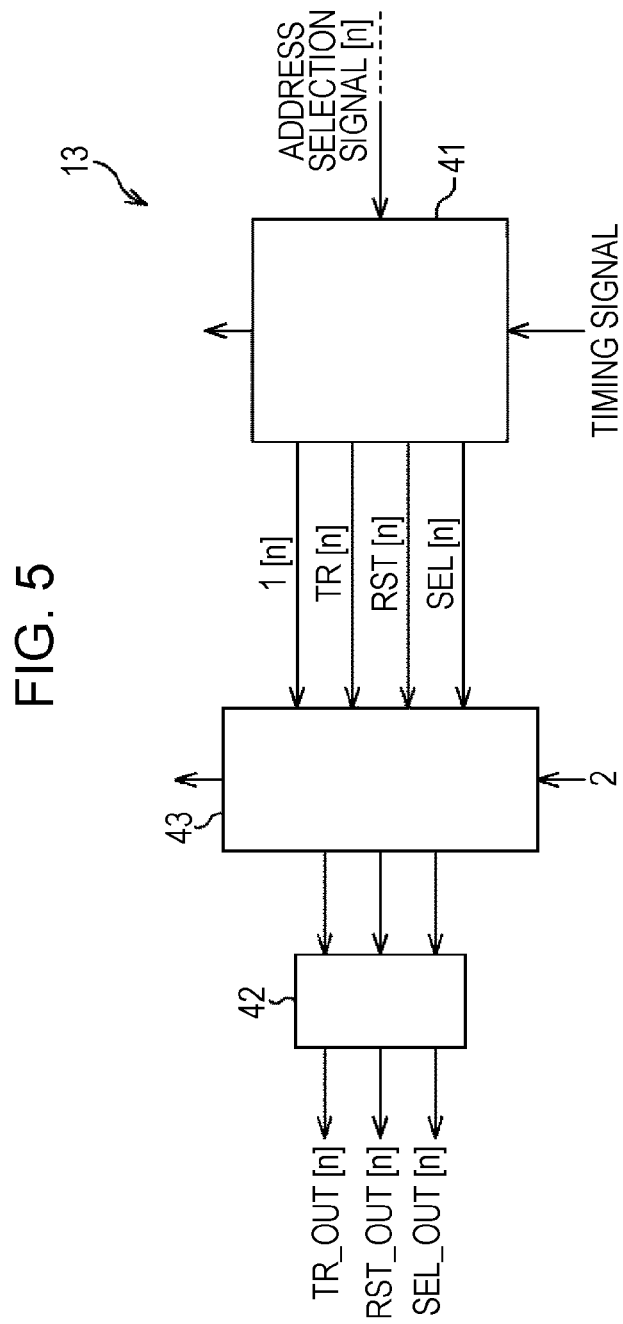
FIG. 5 is a block diagram illustrating a configuration example of an embodiment of a vertical scanning circuit to which the present invention is applied.

Next, FIG. 5 is a block diagram illustrating a configuration example of an embodiment of the vertical scanning circuit to which the present invention is applied.

In FIG. 5, the vertical scanning circuit 13 is configured including timing control circuits 41, the drive circuits 42, and output control circuits 43.

Note that, in FIG. 5, the parts common to those in the vertical scanning circuit 13' in FIG. 3 are denoted by the same reference numerals, and that the description thereof will be appropriately omitted below. That is, the vertical scanning circuit 13 in FIG. 5 is common to the vertical scanning circuit 13' in FIG. 3 in including the drive circuits 42. However, the vertical scanning circuit 13 is different from the vertical scanning circuit 13' in including the timing control circuits 41 and the output control circuits 43.

Like the timing control circuit 41' in FIG. 3, a timing signal and an address selection signal [n] are supplied to the timing control circuit 41 from the system control unit 12, and the timing control circuit 41 generates a drive timing signal TR[n], a drive timing signal RST[n], and a drive timing signal SEL[n] and supplies the signals to the output control circuit 43.

Also, the timing control circuit 41 generates a control signal 1[n] and supplies the signal to the output control circuit 43 in accordance with a charge read operation of the pixels 21, as described below with reference to FIG. 15. Also, in a case where a signal supplied from a circuit in the preceding stage to the timing control circuit 41 can be used as the control signal 1[n], the timing control circuit 41 allows the control signal 1[n] to pass therethrough and supplies the signal to the output control circuit 43.

The control signal 1[n], the drive timing signal TR[n], the drive timing signal RST[n], and the drive timing signal SEL [n] are supplied from the timing control circuit 41 to the output control circuit 43, and also a control signal is supplied from the system control unit 12 to the output control circuit 43.

The control signal 2 supplied to the output control circuit 43 is, for example, a clear signal for initializing the output control circuit 43 (clearing the internal state), an enable signal for switching between normal drive and drive for discharging unnecessary charges, or the like. Additionally, the control signal 2 is used in the output control circuits 43 for the respective rows in common. For example, the control signal 2 is supplied to the output control circuit 43 for the n-th row via the output control circuit 43 for the n−1-th row, and the output control circuit 43 for the n-th row supplies the control signal 2 to the output control circuit 43 for the n+1-th row.

On the basis of the control signal 1[n] and the control signal 2, the output control circuit 43 changes the drive timing signal TR[n], the drive timing signal RST[n], and the drive timing signal SEL[n], and supplies the signals to the drive circuit 42.

For example, the output control circuit 43 changes the drive timing signal TR[n] so that the drive signal TR_OUT[n] output from the drive circuit 42 is inverted in the non-accumulation period. Also, for example, the output control circuit 43 changes the drive timing signal RST[n] so that the drive signal RST_OUT[n] output from the drive circuit 42 is inverted in the horizontal scanning period when a shutter process is being performed, the horizontal scanning period when a charge accumulation process is being performed, and the non-accumulation period.

Then, the drive circuit 42 supplies the drive signal TR_OUT[n], the drive signal RST_OUT[n], and the drive signal SEL_OUT[n] to the pixels 21n in accordance with the drive timing signal TR[n], the drive timing signal RST[n], and the drive timing signal SEL[n] supplied from the output control circuit 43.

Figure 6:
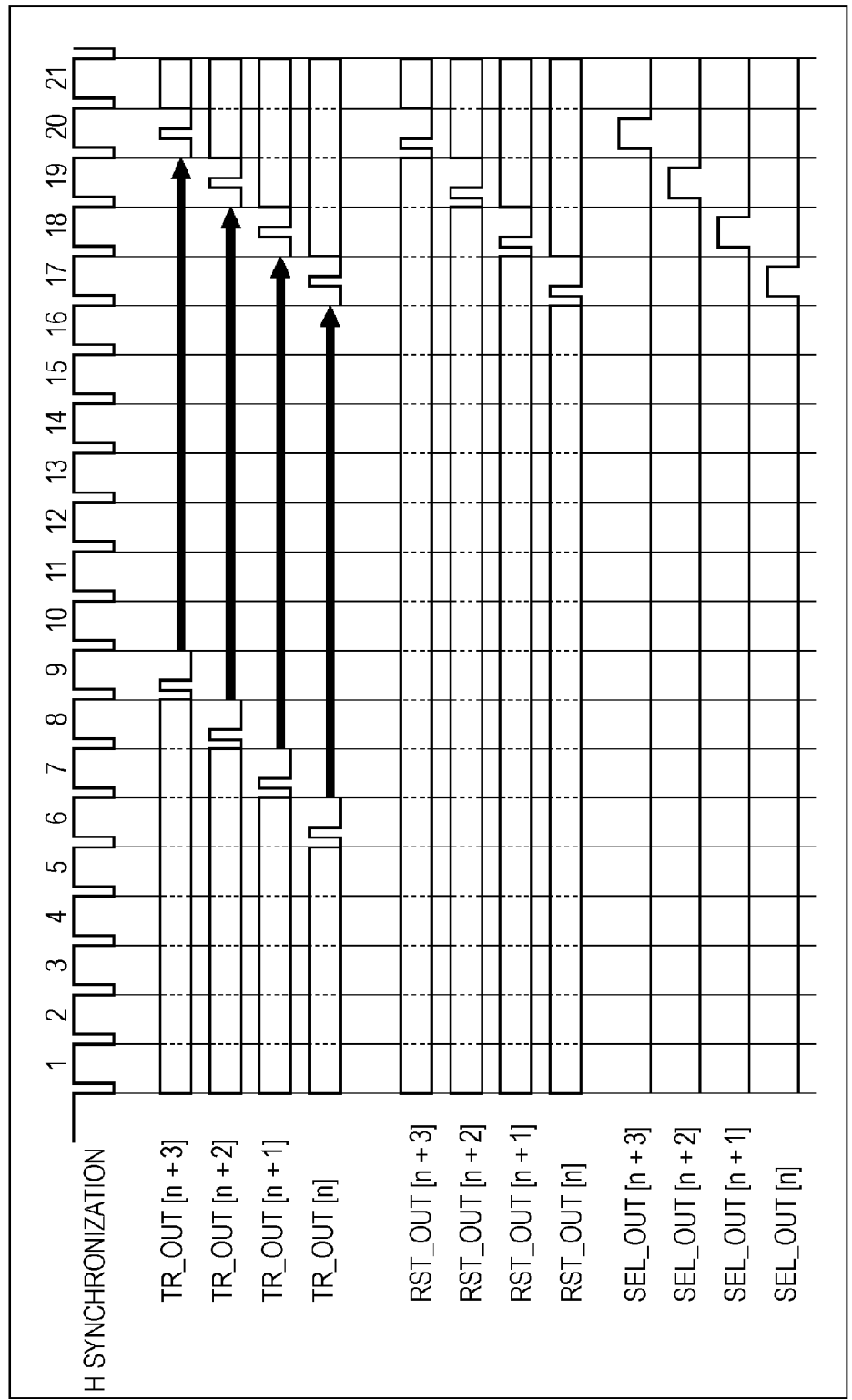
FIG. 6 is a timing chart explaining an operation of the pixels 21.

Next, FIG. 6 is a timing chart explaining respective signals supplied to the pixels 21.

As in FIG. 4, an H synchronization signal, drive signals TR_OUT[n] to TR_OUT[n+3], drive signals RST_OUT[n] to RST_OUT[n+3], and drive signals SEL_OUT [n] to SEL_OUT[n+3] are illustrated in order from the top in FIG. 6.

As illustrated in FIG. 6, the drive signals TR_OUT[n] to TR_OUT[n+3] are the same as the drive signals TR_OUT[n] to TR_OUT[n+3] in the timing chart in FIG. 4 in the horizontal scanning periods when a shutter process, a charge accumulation process, and a read process are being performed. However, in FIG. 6, the drive signals TR_OUT[n] to TR_OUT[n+3] are different from the drive signals TR_OUT [n] to TR_OUT[n+3] in the timing chart in FIG. 4 in being at the H-level in the non-accumulation periods.

That is, the drive signal TR_OUT[n] is at the H-level in the horizontal scanning periods 1H to 5H, and decreases to the L-level and then increases in a pulse-like manner to the H-level in the horizontal scanning period 6H. After that, the drive signal TR_OUT[n] is at the L-level in the horizontal scanning periods 7H to 16H, increases in a pulse-like manner to the H-level in the horizontal scanning period 17H, and is at the H-level from the horizontal scanning period 18H. That is, the drive signal TR_OUT[n] is at the H-level in the horizontal scanning periods 1H to 5H and the horizontal scanning periods 18H to 21H, which are non-accumulation periods.

Like the drive signal TR_OUT[n], the drive signal TR_OUT[n+1] is at the H-level in the horizontal scanning periods 1H to 6H and the horizontal scanning periods 19H to 21H, which are non-accumulation periods. Hereinafter, likewise, the drive signal TR_OUT[n+2] is at the H-level in the horizontal scanning periods 1H to 7H and the horizontal scanning periods 20H to 21H, and the drive signal TR_OUT [n+3] is at the H-level in the horizontal scanning periods 1H to 8H and the horizontal scanning period 21H.

Also, the drive signals RST_OUT[n] to RST_OUT[n+3] are the same as the drive signals RST_OUT[n] to RST_OUT [n+3] in the timing chart in FIG. 4 in the horizontal scanning period when a read process is being performed. However, the drive signals RST_OUT[n] to RST_OUT[n+3] are different from the drive signals RST_OUT[n] to RST_OUT[n+3] in the timing chart in FIG. 4 in being at the H-level in the horizontal scanning period when a shutter process is being performed, the horizontal scanning period when a charge accumulation process is being performed, and the non-accumulation period.

That is, the drive signal RST_OUT[n] is at the H-level in the horizontal scanning periods 1H to 16H, and decreases to the L-level and then increases in a pulse-like manner to the H-level in the horizontal scanning period 17H. After that, the drive signal RST_OUT[n] is at the H-level in the horizontal scanning periods 18H to 21H. That is, the drive signal RST_OUT[n] is at the H-level in the horizontal scanning periods 1H to 16H and the horizontal scanning periods 19H to 21H, which are the horizontal scanning period when a shutter process is being performed, the horizontal scanning period when a charge accumulation process is being performed, and the non-accumulation period.

Like the drive signal RST_OUT[n], the drive signal RST_OUT[n+1] is at the H-level in the horizontal scanning periods 1H to 17H and the horizontal scanning periods 19H to 21H, which are the horizontal scanning period when a shutter process is being performed, the horizontal scanning period when a charge accumulation process is being performed, and the non-accumulation period. Hereinafter, likewise, the drive signal RST_OUT[n+2] is at the H-level in the horizontal scanning periods 1H to 18H and the horizontal scanning periods 20H and 21H. The drive signal RST_OUT[n+3] is at the H-level in the horizontal scanning periods 1H to 18H and the horizontal scanning period 21H.

Also, the drive signals SEL_OUT[n] to SEL_OUT[n+3] are the same as the drive signals SEL_OUT[n] to SEL_OUT[n+3] in the timing chart in FIG. 4.

Each of the pixels 21 discharges a charge generated through photoelectric conversion performed by the photodiode 31 when both the drive signal TR_OUT and the drive signal RST_OUT are at the H-level, and thus constantly discharges the charge in the non-accumulation period by operating in accordance with the drive signals illustrated in the timing chart in FIG. 6. Accordingly, even if intense light enters the photodiode 31 in the non-accumulation period, the charge generated through photoelectric conversion performed by the photodiode 31 is discharged without being accumulated in the photodiode 31. Therefore, the pixels 21 can avoid the occurrence of the blooming phenomenon described above with reference to the timing chart in FIG. 4.

Also, the drive signal RST_OUT is at the H-level also in the horizontal scanning period when a shutter process is being performed and the horizontal scanning period when a charge accumulation process is being performed. Therefore, in each of the pixels 21, even if intense light enters the photodiode 31 and a charge overflows from the photodiode 31 in a charge accumulation process, the charge is not accumulated in the floating diffusion 36 and the occurrence of the blooming phenomenon is avoided.

Also, regarding the shutter process, charge accumulation process, and read process, the drive signals illustrated in the timing chart in FIG. 6 and the drive signals illustrated in the timing chart in FIG. 4 are the same, and thus the pixels 21 can output pixel signals as in the related art.

Figure 7:
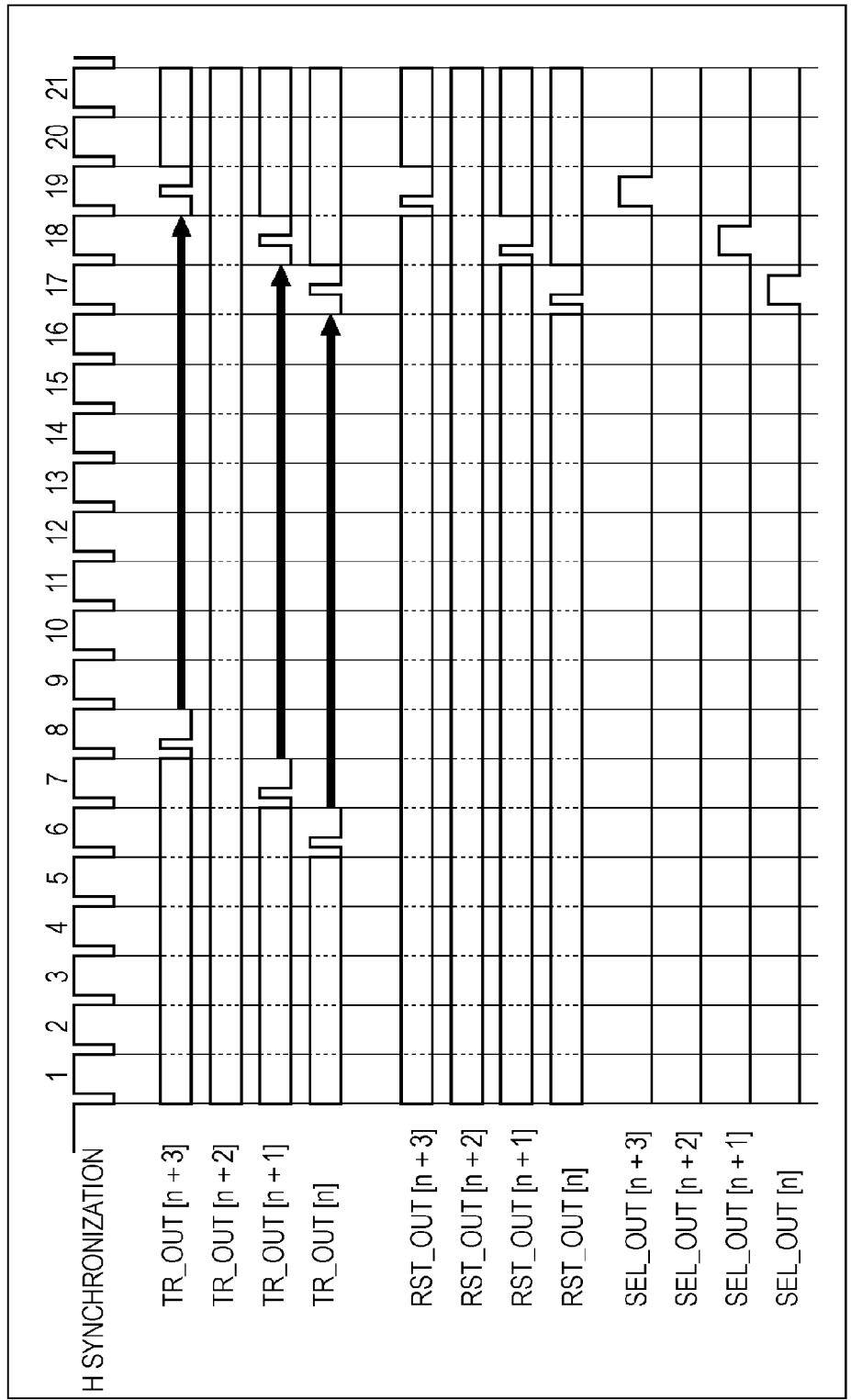
FIG. 7 is a timing chart explaining an operation of the pixels 21 in a case where a thinning process is performed.

Next, FIG. 7 is a timing chart explaining respective signals output from the vertical scanning circuit 13 in a case where a thinning process is performed in the CMOS sensor 11 in FIG. 1.

For example, when an image for three-fourths of the total number of pixels in the pixel array 14 is to be captured, pixel signals from the pixels in a one-in-four row are not read and pixel signals are read from the pixels in the other three rows. In the example in FIG. 7, pixel signals of the pixels n+2 in the n+2-th row are not read.

In the pixels n+2 from which pixel signals are not read, a shutter process, a charge accumulation process, and a read process are not performed, and thus the drive signals TR_OUT[n+2] and RST_OUT[n+2] are constantly at the H-level as illustrated in FIG. 7.

In this way, by causing the drive signals TR_OUT[n+2] and RST_OUT[n+2] of the pixels n+2 from which pixel signals are not read to be constantly at the H-level, charges generated through photoelectric conversion performed by the photodiodes 31 of the pixels n+2 are constantly discharged. Therefore, in the pixels 21, even if intense light enters the photodiodes 31 of the pixels n+2, charges are not constantly accumulated in the photodiodes 31 and the floating diffusions 36, and thus the occurrence of the blooming phenomenon can be avoided.

Also, in the conventional CMOS sensor, a shutter process for avoiding the occurrence of the blooming phenomenon needs to be performed and a circuit for performing the shutter process needs to be provided. The circuit for performing the shutter process for avoiding the occurrence of the blooming phenomenon requires a memory for storing pixels from which pixel signals are not read in accordance with the type of thinning process and means for determining the timing to perform the shutter process, so that the configuration of the circuit becomes complicated.

In contrast, in the CMOS sensor 11, the circuit for performing the shutter process for avoiding the occurrence of the blooming phenomenon is not required. Also, the output control circuit 43 only needs to invert the drive signal TR_OUT and the drive signal RST_OUT in the non-accumulation period and invert the drive signal RST_OUT in the horizontal scanning period when a shutter process is being performed and the horizontal scanning period when a charge accumulation process is being performed, and thus the circuit configuration can be simplified.

In addition, in the CMOS sensor 11, one pixel may have a plurality of photodiodes, for example, instead of using the example illustrated in FIG. 2 where one pixel 21 has one photodiode 31. In a case where one pixel has a plurality of photodiodes, some of the transistors constituting the pixel may be shared so as to reduce the entire pixel size.

Figure 8:
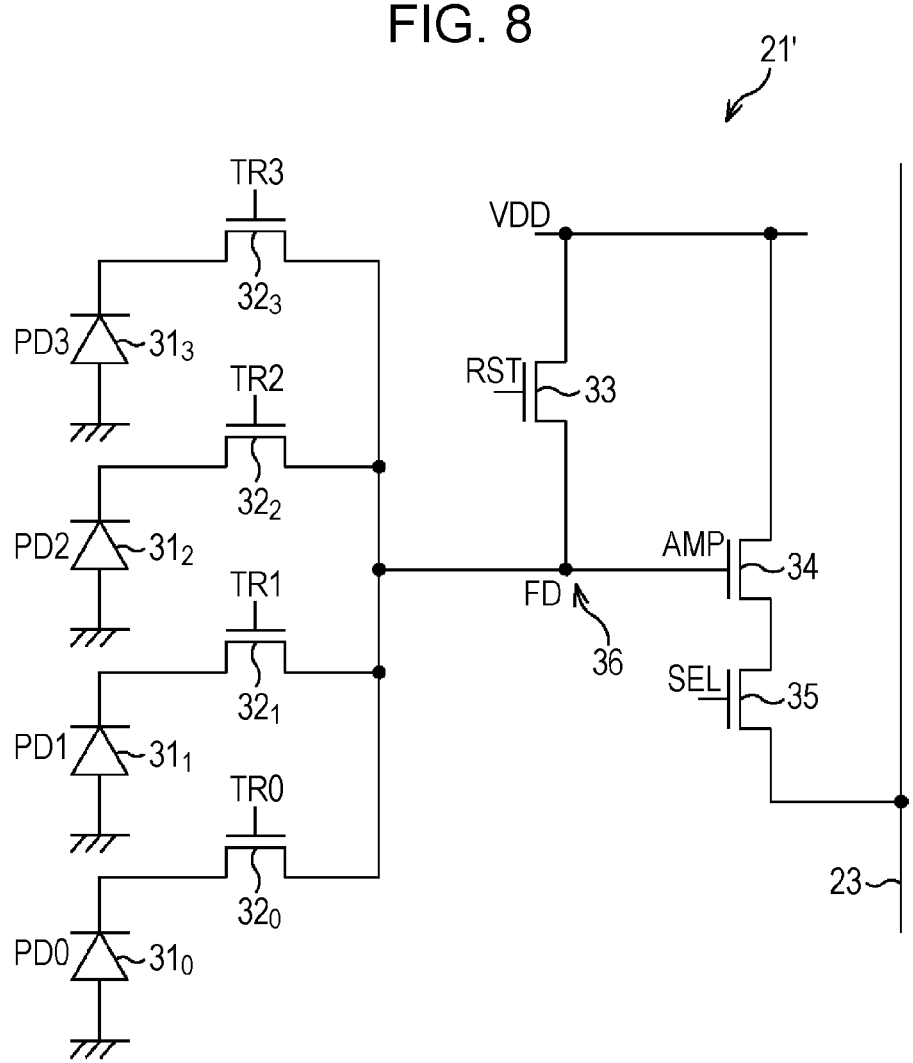
FIG. 8 is a circuit diagram illustrating a configuration example of a pixel 21'.

Next, FIG. 8 is a circuit diagram illustrating another configuration example of a pixel.

In FIG. 8, a pixel 21' is configured including four photodiodes $31_0$ to $31_3$, four transfer transistors $32_0$ to $32_3$, a reset transistor 33, an amplifying transistor 34, a selection transistor 35, and a floating diffusion 36.

Note that, in FIG. 8, the parts common to those in the pixel 21 in FIG. 2 are denoted by the same reference numerals, and the description thereof will be appropriately omitted below. That is, the pixel 21' in FIG. 8 is common to the pixel 21 in FIG. 2 in including the reset transistor 33, the amplifying transistor 34, the selection transistor 35, and the floating diffusion 36. However, the pixel 21' is different from the pixel 21 in including the four photodiodes $31_0$ to $31_3$ and the four transfer transistors $32_0$ to $32_3$.

As illustrated in FIG. 8, the photodiodes $31_0$ to $31_3$ are connected to the floating diffusion 36 via the transfer transistors $32_0$ to $32_3$, respectively. In the pixel 21', the transfer transistors $32_0$ to $32_3$ are sequentially brought into the H-level, so that the charges generated through photoelectric conversion performed by the photodiodes $31_0$ to $31_3$ are sequentially accumulated in the floating diffusion 36.

In the pixel 21', the reset transistor 33, the amplifying transistor 34, the selection transistor 35, and the floating diffusion 36 are shared by the four photodiodes $31_0$ to $31_3$, and thus restriction is imposed on the drive timing. Note that a system in which the reset transistor 33, the amplifying transistor 34, the selection transistor 35, and the floating diffusion 36 are shared by four pixels in the vertical direction (column) is called a vertical four-pixel sharing system.

Figure 9:
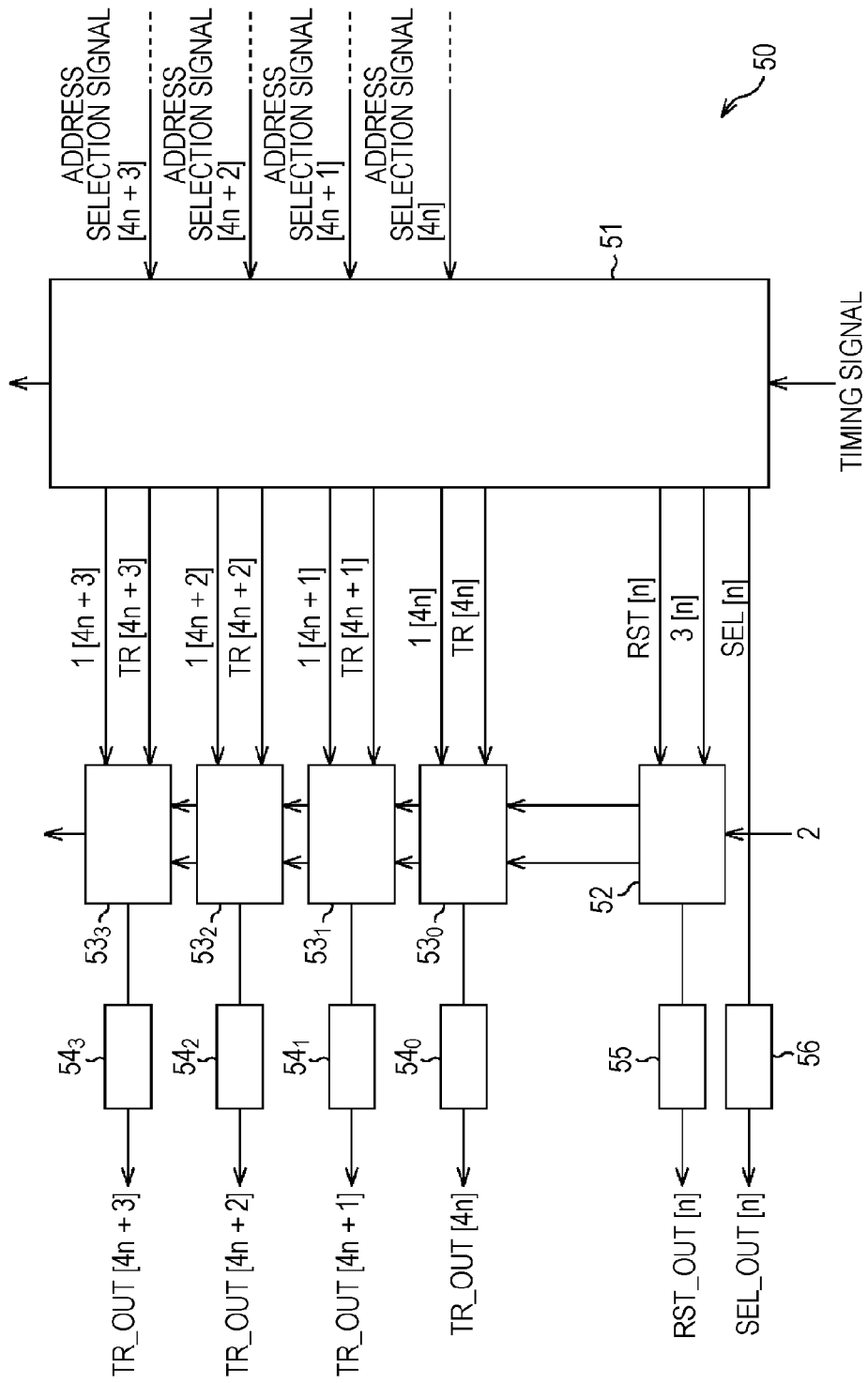
FIG. 9 is a block diagram illustrating a configuration example of a vertical scanning circuit that supplies respective signals to pixels 21'.

Next, FIG. 9 is a block diagram illustrating a configuration example of a vertical scanning circuit that supplies respective signals to the pixel 21' in FIG. 8.

In FIG. 9, the vertical scanning circuit 50 is configured including a timing control circuit 51, a pixel sharing determination circuit 52, four output control circuits $53_0$ to $53_3$, four transfer transistor drive circuits $54_0$ to $54_3$, a reset transistor drive circuit 55, and a selection transistor drive circuit 56.

The vertical scanning circuit 50 requires drive signals TR_OUT[$4n$] to TR_OUT[$4n+3$] independent of each other in order to drive the four transfer transistors $32_0$ to $32_3$ included in the pixel 21', and is provided with the four output control circuits $53_0$ to $53_3$ and the four transfer transistor drive circuits $54_0$ to $54_3$. Also, since the pixel 21' includes one reset transistor 33 and one selection transistor 35, the vertical scanning circuit 50 is provided with one reset transistor drive circuit 55 and one selection transistor drive circuit 56.

That is, in the vertical scanning circuit 50, an output control circuit and a transfer transistor drive circuit are provided for each row, and the reset transistor drive circuit 55 and the selection transistor drive circuit 56 are provided for every four rows.

Address selection signals [$4n$] to [$4n+3$] and a timing signal are supplied to the timing control circuit 51 from the system control unit 12.

The timing control circuit 51 generates drive timing signals TR[$4n$] to TR[$4n+3$], control signals 1[$4n$] to 1[$4n+3$], a drive timing signal RST[n], a control signal 3[n], and a drive timing signal SEL[n] using the address selection signals [$4n$] to [$4n+3$] and the timing signal.

The timing control circuit 51 supplies the drive timing signals TR[$4n$] to TR[$4n+3$] and the control signals 1[$4n$] to 1[$4n+3$] to the output control circuits $53_0$ to $53_3$, respectively. Also, the timing control circuit 51 supplies the drive timing signal RST[n] and the control signal 3[n] to the pixel sharing determination circuit 52 and supplies the drive timing signal SEL[n] to the selection transistor drive circuit 56.

A control signal 2 is supplied to the pixel sharing determination circuit 52 and the output control circuits $53_0$ to $53_3$ from the system control unit 12. The control signal 2 is used in common for the pixel sharing determination circuits 52 and the output control circuits $53_0$ to $53_3$ for the respective rows.

The pixel sharing determination circuit 52 is a circuit for supplying, to the transfer transistor drive circuits $54_0$ to $54_3$, a signal indicating that a read process is being performed in any of the photodiodes $31_0$ to $31_3$ so that charges of the other photodiodes are not transferred to the floating diffusion 36 when a read process is being performed on one of the photodiodes $31_0$ to $31_3$ that share the floating diffusion 36. The pixel sharing determination circuit 52 will be described below with reference to FIG. 12.

Like the output control circuit 43 in FIG. 5, the output control circuits $53_0$ to $53_3$ change the periods of the drive timing signals TR[$4n$] to TR[$4n+3$], respectively, so that partial periods of the drive signals TR_OUT[4] to TR_OUT[$4n+3$] output from the transfer transistor drive circuits $54_0$ to $54_3$ are inverted, and supplies the signals to the transfer transistor drive circuits $54_0$ to $54_3$.

The transfer transistor drive circuits $54_0$ to $54_3$ generate the drive signals TR_OUT[$4n$] to TR_OUT[$4n+3$] for driving the transfer transistors $32_0$ to $32_3$ in accordance with the drive timing signals TR[$4n$] to TR[$4n+3$] and output the signals.

The reset transistor drive circuit 55 generates a drive signal RST_OUT[n] for driving the reset transistor 33 in accordance with the drive timing signal RST[n] supplied from the pixel sharing determination circuit 52 and outputs the signal, like the drive circuit 42.

The selection transistor drive circuit 56 generates a drive signal SEL_OUT[n] for driving the selection transistor 35 in accordance with the drive timing signal SEL[n] supplied from the timing control circuit 51 and outputs the signal, like the drive circuit 42.

Next, the signals output from the timing control circuit 51 will be described with reference to the timing chart in FIG. 10.

The drive signals TR_OUT[$4n$] to TR_OUT[$4n+3$] are the same as the drive signals TR_OUT[n] to TR_OUT[n+3] in FIG. 6 in the horizontal scanning periods when a shutter process, a charge accumulation process, and a read process are being performed. The drive signals TR_OUT[$4n$] to TR_OUT[$4n+2$] are different from the drive signals TR_OUT[n] to TR_OUT[n+3] in FIG. 6 in being at the L-level from the horizontal scanning period next to the horizontal scanning period when a read process is being performed to the horizontal scanning period when a read process of the drive signal TR_OUT[$4n+3$] is being performed.

In the pixel 21', the photodiodes $31_0$ to $31_3$ share the floating diffusion 36. Thus, when a read process of a photodiode is being performed, discharge of charges from the other photodiodes needs to be stopped.

That is, the drive signal TR_OUT[$4n$] is at the L-level in the horizontal scanning period 18H when a read process of the photodiode $31_1$ is being performed, and the drive signals TR_OUT and TR_OUT [$4n+1$] are at the L-level in the horizontal scanning period 19H when a read process of the photodiode $31_2$ is being performed. Also, the drive signals TR_OUT[$4n$] to TR_OUT[$4n+2$] are at the L-level in the horizontal scanning period 20H when a read process of the photodiode $31_3$ is being performed.

Then, the drive signals TR_OUT[$4n$] to TR_OUT[$4n+2$] simultaneously increase to the H-level in the horizontal scanning period 21H.

The photodiodes $31_0$ to $31_3$ sequentially perform a read process in the horizontal scanning periods 17H to 20H, and thus the drive signal RST_OUT[n] and the drive signal SEL_OUT[n] continuously output drive pulses in those periods.

Figure 10:
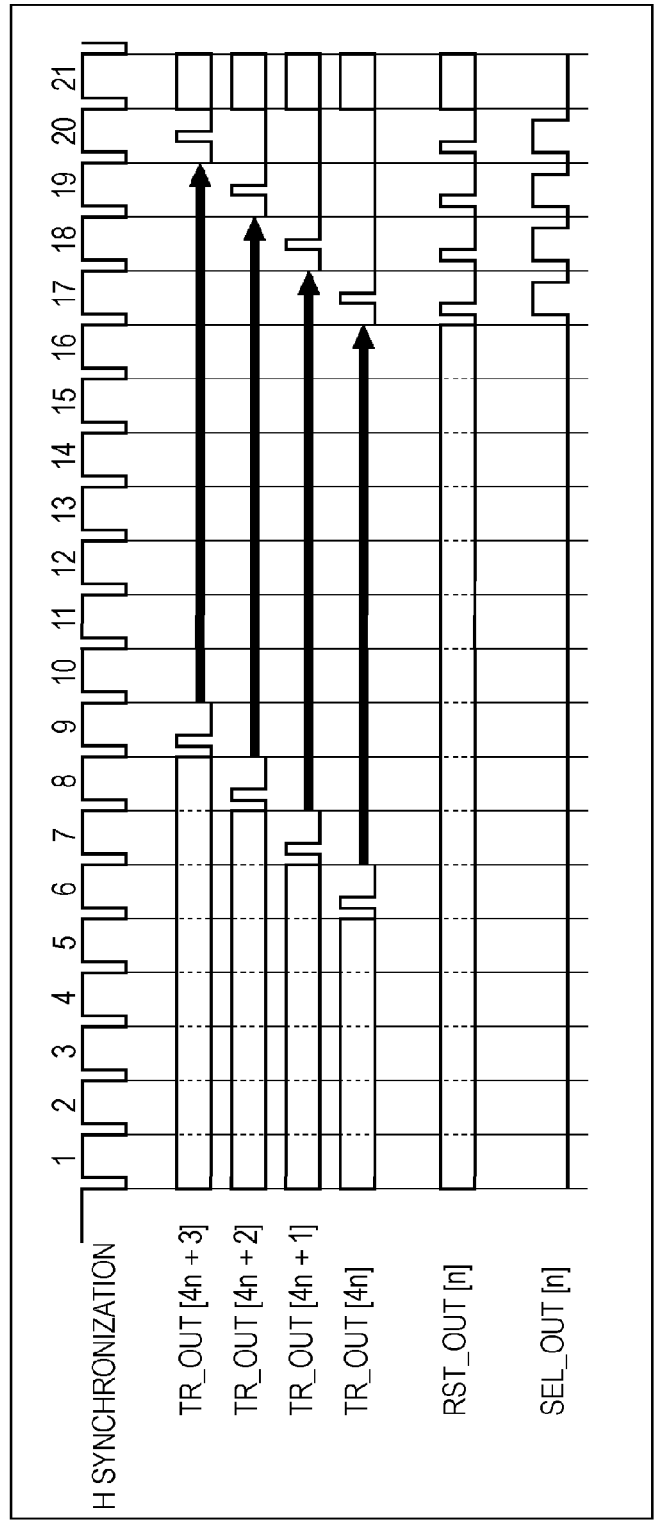
FIG. 10 is a timing chart explaining signals output from a timing control circuit 51.

Due to the output of the signals illustrated in FIG. 10, it can be prevented that charges from the photodiodes $31_0$ to $31_3$ except the photodiode as a read target among the photodiodes $31_0$ to $31_3$ flow into a charge from the photodiode as the read target even if the floating diffusion 36 is shared by the photodiodes $31_0$ to $31_3$ in the pixel 21', so that a target pixel signal can be normally output.

Figure 11:
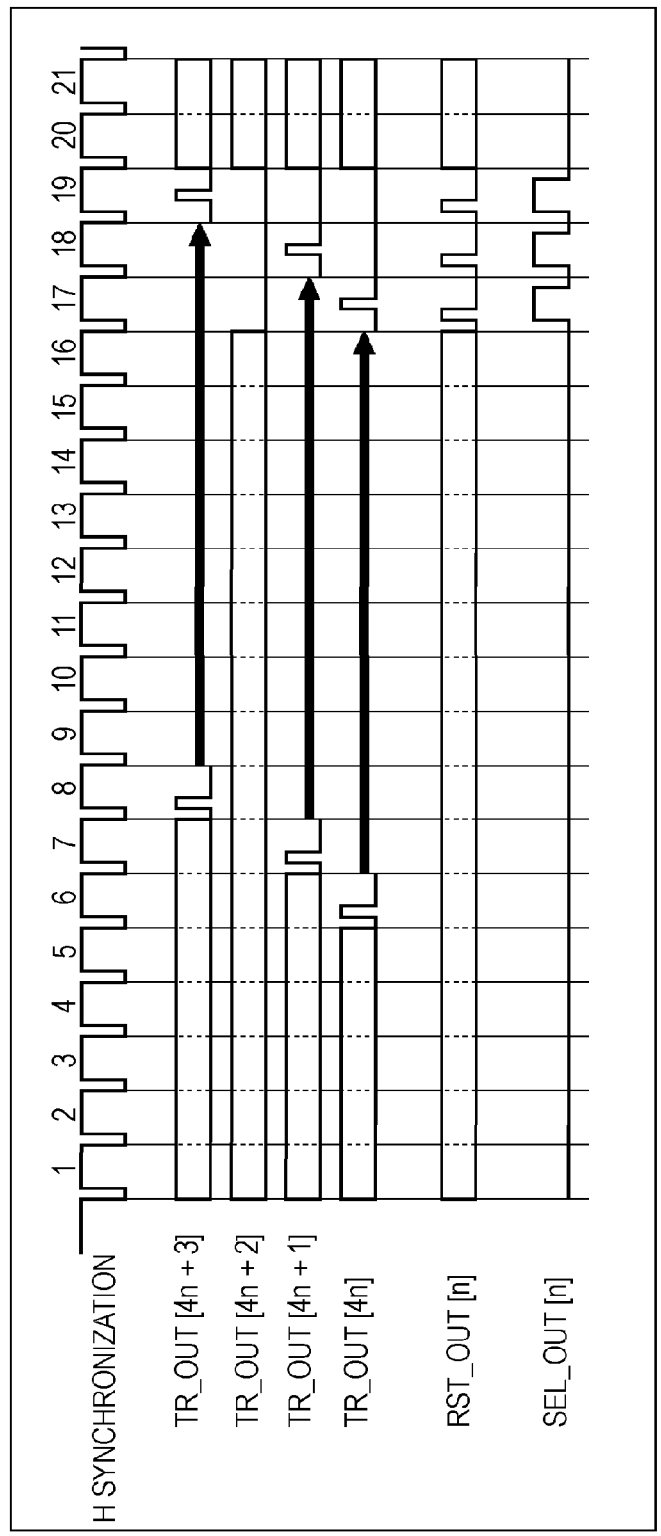
FIG. 11 is a timing chart explaining signals output from the timing control circuit 51 in a case where a thinning process is performed.

Next, FIG. 11 is a timing chart explaining signals output from the transfer transistor drive circuits $54_0$ to $54_3$, the reset transistor drive circuit 55, and the selection transistor drive circuit 56 in a case where a thinning process is performed.

In FIG. 11, a description will be given about a case where pixel signals from the photodiodes $31_2$ corresponding to the pixels n+2 in the n+2-th row are not read, as in the timing chart in FIG. 7.

As described above, when a read process of any of the photodiodes $31_0$ to $31_3$ is being performed, the drive signals TR_OUT[$4n$] to TR_OUT[$4n+3$] supplied to the photodiodes that are not the target of the read process are at the L-level.

This is the same for the drive signal TR_OUT[$4n+2$] of the photodiode $31_2$ from which a pixel signal is not read.

That is, as illustrated in FIG. 11, the drive signal TR_OUT[$4n+2$] is at the L-level in the horizontal scanning periods 17H to 19H when a read process of the photodiode $31_0$ is performed in the horizontal scanning period 17H, when a read process of the photodiode $31_1$ is performed in the horizontal scanning period 18H, and when a read process of the photodiode $31_3$ is performed in the horizontal scanning period 19H.

Also, the drive signal TR_OUT[$4n+2$] is at the H-level in the horizontal scanning periods other than the horizontal scanning periods 17H to 19H. Thus, even in a case where a pixel signal is not read from the photodiode $31_2$, the charge generated through photoelectric conversion performed by the photodiode $31_2$ is constantly discharged in the horizontal scanning periods other than the horizontal scanning periods 17H to 19H. Accordingly, the occurrence of the blooming phenomenon can be avoided.

Also, for example, when the position of rows to be thinned or the number of rows to be thinned is changed, modification or addition of a circuit is required in accordance with the change in a case where there is provided a circuit for performing a shutter process for avoiding the occurrence of the blooming phenomenon. In the vertical scanning circuit 50, the output control circuit 53 for each row can generate a drive signal TR_OUT on the basis of a control signal of each row, and thus such modification or addition of a circuit is unnecessary.

Also, in a case where a process of cropping the angle of view is performed, pixel signals are not read from the pixels 21 in an upper portion and a lower portion of the pixel array 14. Even for such pixels 21, the occurrence of the blooming phenomenon can be avoided using the process described with reference to FIG. 11.

Figure 12:
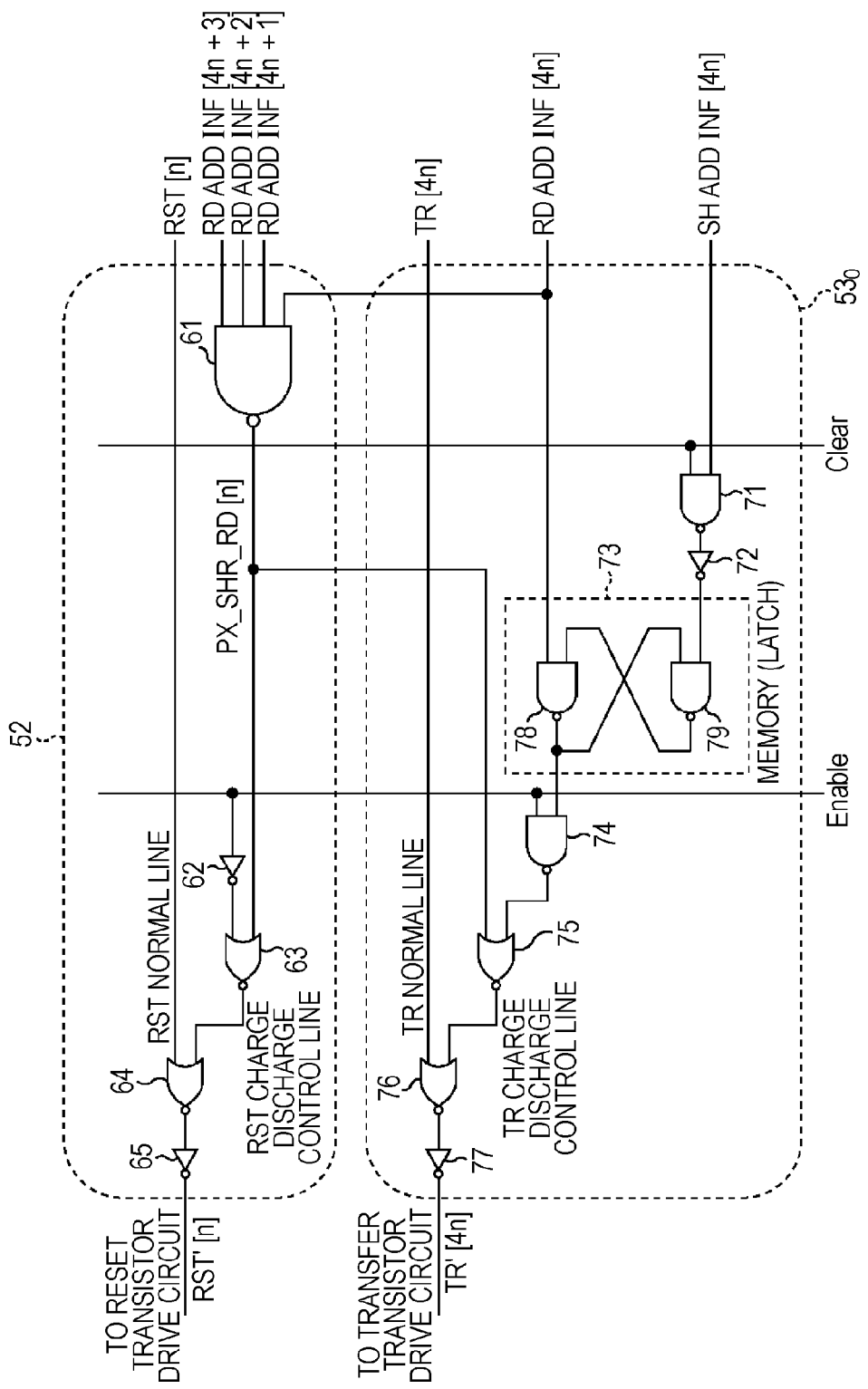
FIG. 12 is a circuit diagram illustrating a configuration example of a pixel sharing determination circuit 52 and an output control circuit $53_0$.

Next, FIG. 12 is a circuit diagram illustrating a configuration example of the pixel sharing determination circuit 52 and the output control circuit $53_0$ in FIG. 9. Note that the respective output control circuits $53_0$ to $53_3$ have the same configuration and operate in the same manner. Hereinafter, a description about the output control circuits $53_1$ to $53_3$ is omitted.

In FIG. 12, the pixel sharing determination circuit 52 is configured including a NAND gate 61, an inverter 62, NOR gates 63 and 64, and an inverter 65.

A drive timing signal RST[n] is supplied to the pixel sharing determination circuit 52 from the timing control circuit 51, and read address selection signals RD_ADD_INF[$4n$] to RD_ADD_INF[$4n+3$] are supplied as a control signal 3 thereto. Also, an enable signal as a control signal 2 is supplied to the pixel sharing determination circuit 52 from the system control unit 12 via the pixel sharing determination circuits 52 and the output control circuits 53 for the respective rows.

Four input terminals of the NAND gate 61 are connected to signal lines for supplying the read address selection signals RD_ADD_INF[$4n$] to RD_ADD_INF[$4n+3$], respectively, and one of two input terminals of the NOR gate 64 is connected to a signal line for supplying the drive timing signal RST[n] (RST normal line). Also, an input terminal of the inverter 62 is connected to a signal line for supplying the enable signal.

An output terminal of the NAND gate 61 is connected to one of two input terminals of the NOR gate 63. The signal output from the NAND gate 61 is called a sharing pixel determination signal PX_SHR_RD[n]. Also, the output terminal of the NAND gate 61 is connected to an input terminal of a NOR gate 75 of the output control circuit $53_0$.

An output terminal of the inverter 62 is connected to the other of the two input terminals of the NOR gate 63. An output terminal of the NOR gate 63 is connected to the other of the two input terminals of the NOR gate 64, and a signal line connecting the output terminal of the NOR gate 63 and the input terminal of the NOR gate 64 is called an RST charge discharge control line. An output terminal of the NOR gate 64 is connected to an input terminal of the inverter 65. The inverter 65 is connected to the reset transistor drive circuit 55 in FIG. 9, and a changed drive timing signal RST'[n] is output from the inverter 65.

The output control circuit $53_0$ is configured including a NAND gate 71, an inverter 72, a memory 73, a NAND gate 74, NOR gates 75 and 76, and an inverter 77.

A drive timing signal TR[$4n$] is supplied to the output control circuit $53_0$ from the timing control circuit 51, and also a read address selection signal RD_ADD_INF[$4n$] and a shutter address selection signal SH_ADD_INF[$4n$] are supplied as a control signal 1[$4n$] thereto. Also, an enable signal and a clear signal are supplied as a control signal 2 to the output control circuit $53_0$ from the system control unit 12 via the pixel sharing determination circuits 52 and the output control circuits 53 for the respective rows.

One of two input terminals of the NAND gate 71 is connected to a signal line for supplying the shutter address selection signal SH_ADD_INF[$4n$], and the other is connected to a signal line for supplying the clear signal. An output terminal of the NAND gate 71 is connected to the memory 73 via the inverter 72, and also a signal line for supplying the read address selection signal RD_ADD_INF[$4n$] is connected to the memory 73.

The memory 73 is configured including a latch circuit including NAND gates 78 and 79, and the output terminal thereof is connected to one of two input terminals of the NAND gate 74. Also, the other of the two input terminals of the NAND gate 74 is connected to the signal line for supplying the enable signal.

An output terminal of the NAND gate 74 is connected to one of two input terminals of the NOR gate 75, and the sharing pixel determination signal PX_SHR_RD[n] is supplied to the other thereof from the NAND gate 61. An output terminal of the NAND gate 75 is connected to one of two input terminals of the NOR gate 76, and a signal line connecting the output terminal of the NAND gate 75 and the input terminal of the NOR gate 76 is called a TR charge discharge control line. A signal line for supplying the drive timing signal TR[$4n$] (TR normal line) is connected to the other of the two input terminals of the NOR gate 76.

An output terminal of the NOR gate 76 is connected to an input terminal of the inverter 77. The inverter 77 is connected to the transfer transistor drive circuit $54_0$ in FIG. 9, and a changed drive timing signal TR'[$4n$] is output from the inverter 77.

Here, the read address selection signals RD_ADD_INF[$4n$] to RD_ADD_INF[$4n+3$] are signals that become effective when each of the photodiodes $31_0$ to $31_3$ in FIG. 8 is selected for performing a read process of reading a charge generated through photoelectric conversion in an exposure time, and are effective only in one horizontal scanning period when a read process is being performed. The shutter address selection signal SH_ADD_INF[$4n$] is a signal that becomes effective when performing a shutter process of discharging an unnecessary charge accumulated in the photodiode $31_0$ is selected, and is effective only in one horizontal scanning period when a shutter process is being performed.

The enable signal is a signal for switching between a normal drive timing and a drive timing at which an unnecessary charge can be discharged. The clear signal is a signal for clearing the memory 73 of the output control circuit $53_0$. For example, the memory 73 may be unstable at power-on, and that state is cleared from the outside of the output control circuit $53_0$. Alternatively, a set signal for setting the value of the memory 73 can be used instead of the clear signal.

As described above, the output control circuits $53_0$ to $53_3$ have the same configuration as that of the output control circuit $53_0$, and each of the output control circuits $53_1$ to $53_3$ includes a memory. With this configuration in which memories are included in the output control circuits for respective rows and the memories are controlled using address selection signals of the respective rows, the transfer transistor drive circuits $54_0$ to $54_3$ output the drive signals TR_OUT[$4n$] to TR_OUT[$4n+3$] in accordance with signals output from the output control circuits $53_1$ to $53_3$.

Also, the TR normal line is a path for outputting the drive timing signal TR[$4n$] supplied from the timing control circuit 51, and the TR charge discharge control line is a path for outputting a timing signal indicating a period when an unnecessary charge can be discharged. Then, the changed drive timing signal TR'[$4n$] is determined in accordance with a signal given by OR between the drive timing signal TR[$4n$] and the timing signal indicating a period when an unnecessary charge can be discharged (that is, the signal output from the NOR gate 76).

Also, due to the sharing pixel determination signal PX_SHR_RD[n] that is generated by implementing NAND of the read address selection signals RD_ADD_INF[$4n$] to RDD_ADD_INF[$4n+3$] in the NAND gate 61 of the pixel sharing determination circuit 52, when a read process of any one photodiode of the photodiodes $31_0$ to $31_3$ is being performed, the output control circuit $53_0$ can perform control so that no charge is discharged from the other three photodiodes.

Figure 13:
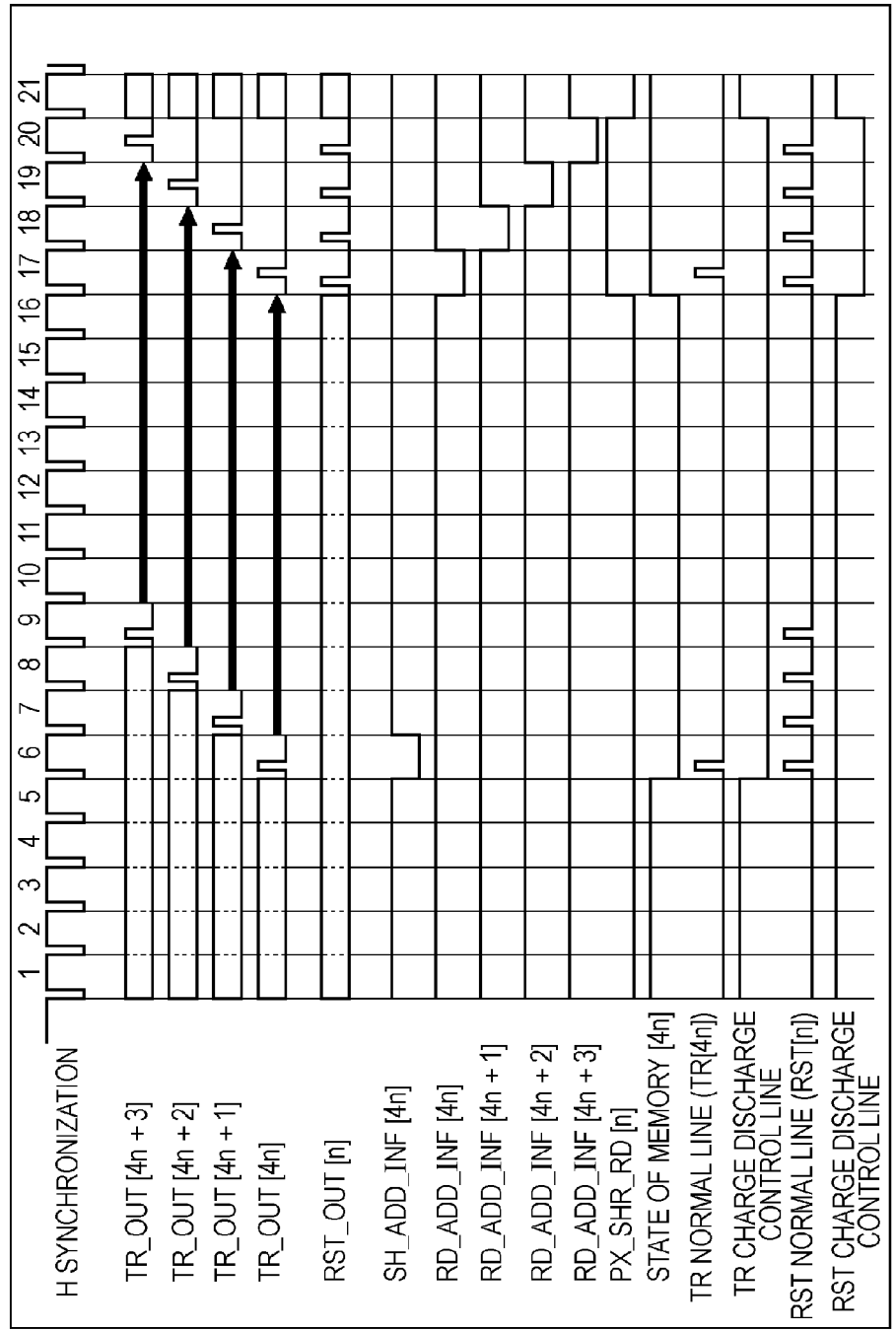
FIG. 13 is a timing chart of respective signals in the pixel sharing determination circuit 52 and the output control circuit $53_0$.

Next, FIG. 13 is a timing chart of respective signals in the pixel sharing determination circuit 52 and the output control circuit $53_0$. With reference to FIG. 13, the drive signal TR_OUT[$4n$] for driving the photodiode $31_0$ will be described.

In the initial state, the memory 73 is at an H-level, and the read address selection signal RD_ADD_INF[$4n$] and shutter address selection signal SH_ADD_INF[$4n$] are at an H-level in the horizontal scanning periods 1H to 5H, and thus the memory 73 is at the H-level in those period.

Also, in the horizontal scanning periods 1H to 5H, the read address selection signals RD_ADD_INF[$4n$] to RD_ADD_INF[$4n+3$] are at the H-level, and thus the sharing pixel determination signal PX_SHR_RD[n] is at the L-level and the TR charge discharge control line is at the H-level. Therefore, in those periods, the drive signal TR_OUT[$4n$] is at the H-level, so that an unnecessary charge generated through photoelectric conversion performed by the photodiode $31_0$ is discharged.

In the horizontal scanning period 6H, a shutter process of the photodiode $31_0$ is performed and thus the shutter address selection signal SH_ADD_INF[$4n$] is at the L-level.

Accordingly, the memory 73 decreases to the L-level and thus the TR charge discharge control line decreases to the L-level, so that the level of the TR normal line, that is, the drive timing signal TR[$4n$], is output as the drive signal TR_OUT[$4n$]. Accordingly, the drive signal TR_OUT[$4n$] increases in a pulse-like manner to the H-level in the horizontal scanning period 6H.

In the horizontal scanning periods 7H to 16H, the drive timing signal TR[$4n$] is at the L-level and the read address selection signal RD_ADD_INF[$4n$] is at the H-level. Thus, in those periods, the drive signal TR_OUT[$4n$] is at the L-level, whereby a charge is accumulated in the photodiode $31_0$. Also, the memory 73 is kept at the L-level.

In the horizontal scanning period 17H, a read process of the photodiode $31_0$ is performed, and thus the read address selection signal RD_ADD_INF[$4n$] decreases to the L-level, whereby the memory 73 increases to the H-level. However, the sharing pixel determination signal PX_SHR_RD[n] increases to the H-level at the same time, and thus the TR charge discharge control line is kept at the L-level. Therefore, the level of the TR normal line, that is, the drive timing signal TR[$4n$], is output as the drive signal TR_OUT[$4n$], and thus the drive signal TR_OUT[$4n$] increases in a pulse-like manner to the H-level in the horizontal scanning period 17H. Also, the memory 73 is kept at the H-level.

Also, in the horizontal scanning period 17H, the sharing pixel determination signal PX_SHR_RD[n] increases to the H-level, whereby the RST charge discharge control line decreases to the L-level. Accordingly, the level of the RST normal line, that is, the drive timing signal RST[n], is output as the drive signal RST_OUT[n], so that the drive signal RST_OUT[n] increases in a pulse-like manner to the H-level in the horizontal scanning period 17H.

Furthermore, as illustrated in FIG. 10, in the horizontal scanning period 17H, the drive signal SEL_OUT[n] increases to the H-level, and thus a pixel signal corresponding to a charge generated through photoelectric conversion performed by the photodiode $31_0$ is read.

In the horizontal scanning periods 18H to 20H, the read address selection signals RD_ADD_INF[$4n+1$] to RD_ADD_INF[$4n+3$] sequentially decrease to the L-level, and thus the sharing pixel determination signal PX_SHR_RD[n] is at the H-level in those periods. Therefore, in those periods, the L level of the drive timing signal TR[$4n$] is output as the drive signal TR_OUT[$4n$].

In the horizontal scanning period 21H, the read address selection signals RD_ADD_INF[$4n$] to RD_ADD_INF[$4n+3$] are at the H-level, and thus the sharing pixel determination signal PX_SHR_RD[n] decreases to the L-level, whereby the TR charge discharge control line increases to the H-level. Therefore, the drive signal TR_OUT[$4n$] increases to the H-level, and an unnecessary charge generated through photoelectric conversion performed by the photodiode $31_0$ is discharged.

In this way, an unnecessary charge generated through photoelectric conversion performed by the photodiode $31_0$ can be discharged. Also, in the photodiodes $31_1$ to $31_3$, an unnecessary charge can be discharged as in the photodiode $31_0$.

Here, for example, when a process of cropping the angle of view or a thinning process is performed and when no pixel signal is read from the photodiode $31_0$ of the pixel 21', the read address selection signal RD_ADD_INF[$4n$] and shutter address selection signal SH_ADD_INF[$4n$] input to the output control circuit $53_0$ do not change, and the state of the memory 73 does not change from the initial state.

Thus, the memory 73 needs to be set at the H-level before starting a process of reading a pixel signal. Accordingly, in the photodiode $31_0$ from which a pixel signal is not read, a period when an unnecessary charge is discharged and a period when the discharge is stopped (that is, a period when a read process of the photodiodes $31_1$ to $31_3$ from which pixel signals are read is being performed) can be repeated.

As the timing for setting the memory 73 at the H-level, just after startup of the CMOS sensor 11 is the optimum.

Figure 14:
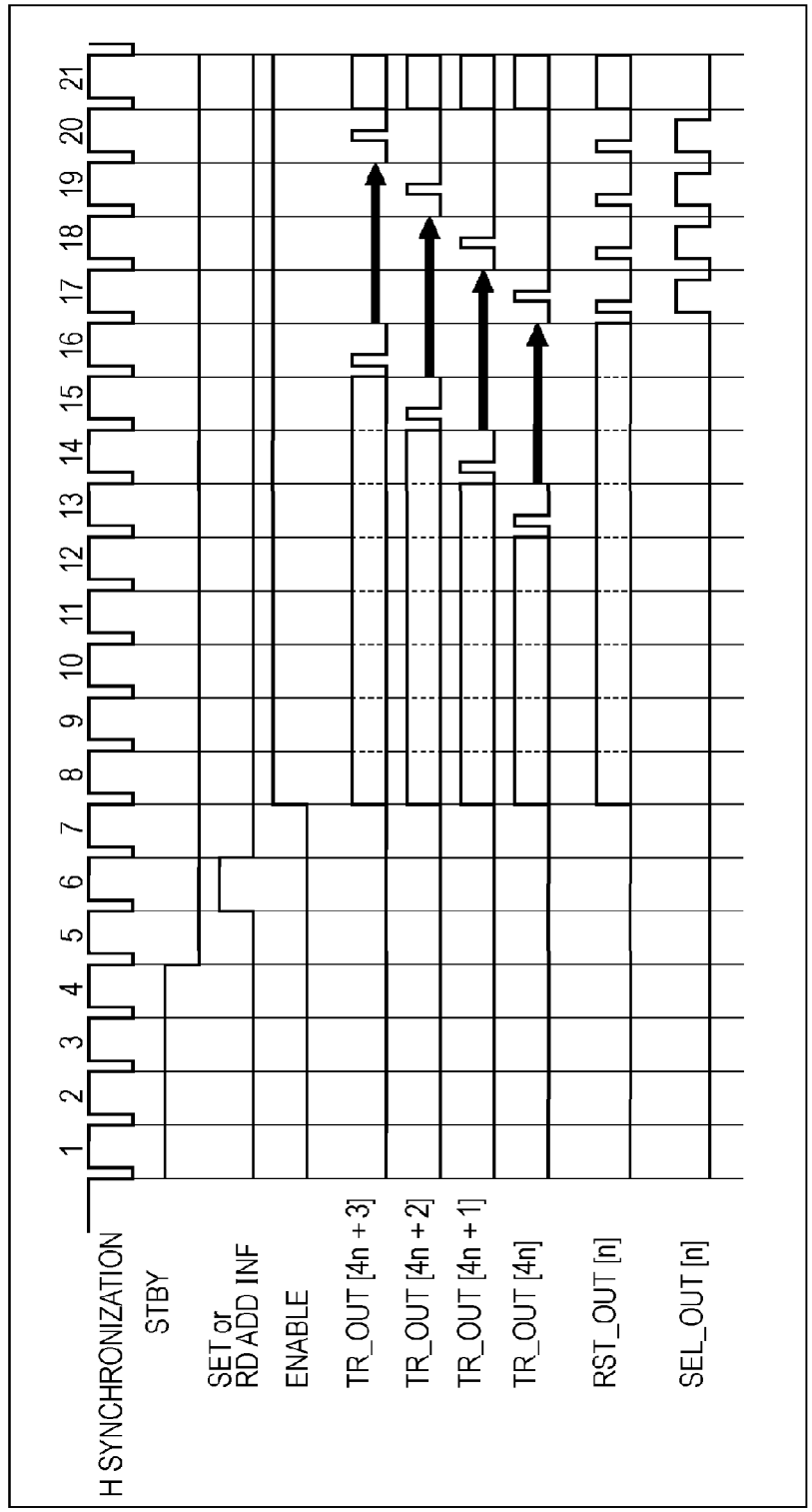
FIG. 14 is a timing chart of respective signals of a vertical scanning circuit 50 at startup of a CMOS sensor 11.

Next, FIG. 14 is a timing chart of respective signals of the vertical scanning circuit 50 at startup of the CMOS sensor 11.

In FIG. 14, a standby (STBY) signal illustrated under an H synchronization signal is a signal for starting the CMOS sensor 11. Inputting this standby signal as a clear signal to the NAND gate 71 of the output control circuit $53_0$ in FIG. 12, for example, causes the memory 73 to be at the L-level. Also, the standby signal is supplied to all the output control circuits 53 for the respective rows.

Additionally, in order to set the memory 73 to the H-level, a method for adding a set signal that increases to the H-level after startup of the CMOS sensor 11 to the control signal 3 or supplying a read address selection signal RD_ADD_INF that increases to the H-level after startup of the CMOS sensor 11 to the output control circuits $53_0$ for all the rows may be used, as illustrated under the standby signal in FIG. 14.

Also, the drive signal RST_OUT and the drive signal TR_OUT do not increase to the H-level only by setting the memory 73 to the H-level. Thus, after the memory 73 is set to the H-level at startup, the enable signal is set to the H-level just before starting a read operation of pixel signals. Accordingly, the drive signal RST_OUT and the drive signal TR_OUT can be set to the H-level, and discharge of an unnecessary charge starts. Then, after that, a shutter process and the like are performed.

Next, for example, in a case where a signal line for the read address selection signal RD_ADD_INF is also used as a signal line for the shutter address selection signal SH_ADD_INF and where the signal line is used in a time sharing manner, the number of signal lines and a decoder circuit can be reduced. In this case, the timing control circuit 51 includes a control signal generating circuit for generating a control signal 1 on the basis of signals transmitted in a time sharing manner. Additionally, an imaging apparatus that uses signal lines in a time sharing manner in this way is called a latch-address-type imaging apparatus.

Figure 15:
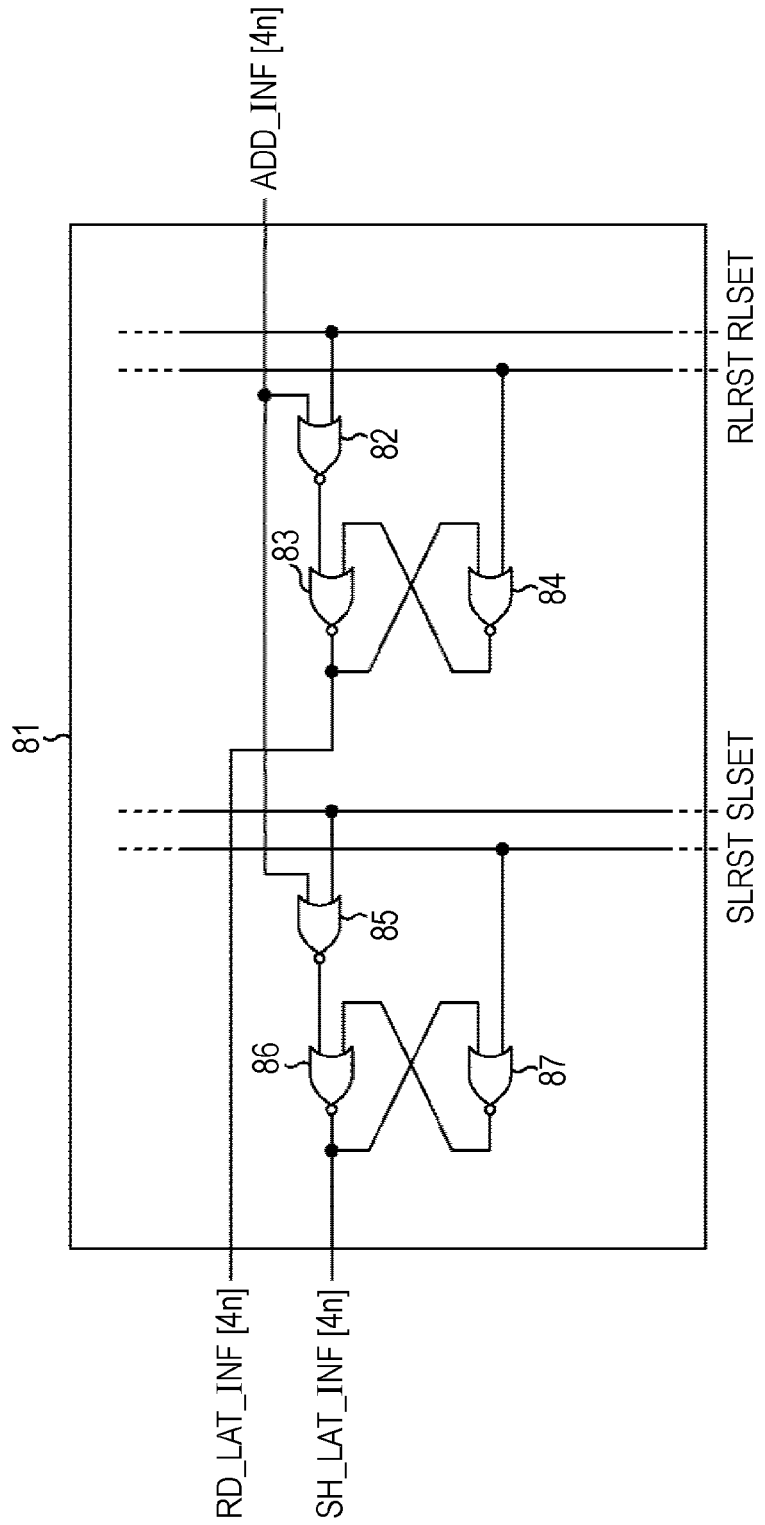
FIG. 15 is a diagram illustrating a configuration example of a control signal generating circuit 81.

FIG. 15 is a diagram illustrating a configuration example of a control signal generating circuit 81 included in the timing control circuit 51.

In FIG. 15, the control signal generating circuit 81 is configured including six NOR gates 82 to 87.

A time-shared address selection signal ADD_INF[$4n$], control signals SLRST and SLSET of a memory for shutter, and control signals RLRST and RLSET of a memory for read are supplied to the control signal generating circuit 81 from the system control unit 12 in FIG. 1.

One of two input terminals of the NOR gate 82 is connected to a signal line for supplying the address selection signal ADD_INF[$4n$], and the other thereof is connected to a signal line for supplying the control signal RLSET of the memory for read.

The NOR gates 83 and 84 constitute a latch circuit and serve as the memory for read. An output terminal of the NOR gate 82 is connected to an input terminal of the NOR gate 83, and an input terminal of the NOR gate 84 is connected to a signal line for supplying the control signal RLRST of the memory for read. Also, the read address selection signal RD_LAT_INF[$4n$] is output from the memory for read, that is, from an output terminal of the NOR gate 83.

That is, the memory for read stores the address selection signal ADD_INF[$4n$], and the read address selection signal RD_LAT_INF[$4n$] that is effective only in one horizontal scanning period is generated in accordance with the control signals RLRST and RLSET of the memory for read.

One of two input terminals of the NOR gate 85 is connected to the signal line for supplying the address selection signal ADD_INF[$4n$], and the other thereof is connected to a signal line for supplying the control signal SLSET of the memory for shutter.

The NOR gates 86 and 87 constitute a latch circuit and serve as the memory for shutter. An output terminal of the NOR gate 85 is connected to an input terminal of the NOR gate 86, and an input terminal of the NOR gate 87 is connected to a signal line for supplying the control signal SLRST of the memory for shutter. Also, the shutter address selection signal SH_LAT_INF[$4n$] is output from the memory for shutter, that is, from an output terminal of the NOR gate 86.

That is, the memory for read stores the address selection signal ADD_INF[$4n$], and the shutter address selection signal SH_LAT_INF[$4n$] that is effective only in one horizontal scanning period is generated in accordance with the control signals SLRST and SLSET of the memory for shutter.

Additionally, the read address selection signal RD_LAT_INF[$4n$] and the shutter address selection signal SH_LAT_INF[$4n$] are supplied to the output control circuit $53_0$ in FIG. 12 as the control signal 1, that is, as the read address selection signal RD_ADD_INF[$4n$] and the shutter address selection signal SH_ADD_INF[$4n$], respectively.

Figure 16:
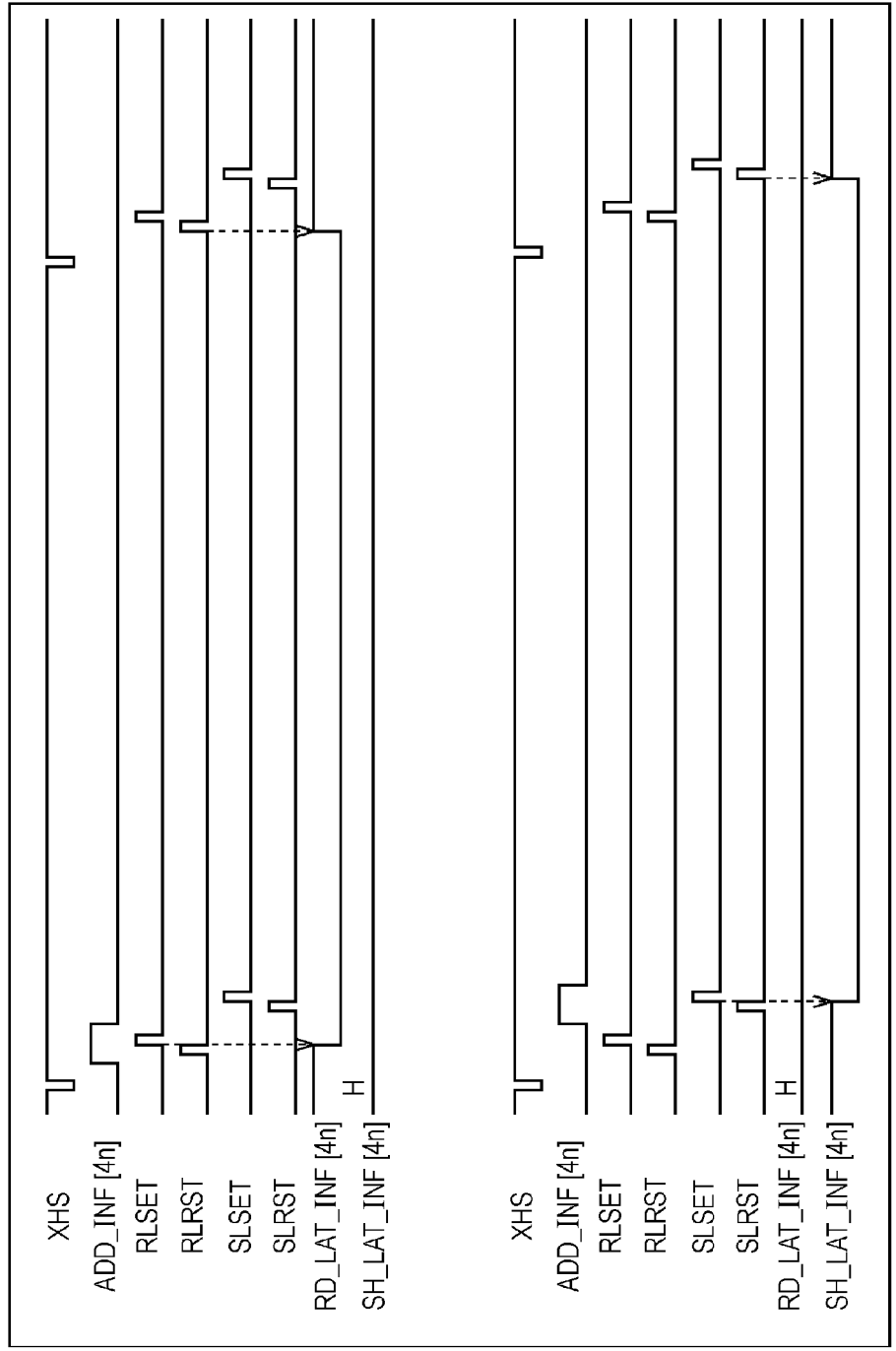
FIG. 16 is a timing chart explaining an operation of the control signal generating circuit 81.

Next, FIG. 16 is a timing chart explaining an operation of the control signal generating circuit 81.

A timing chart of changing the level of the read address selection signal RD_LAT_INF[$4n$] is illustrated on the upper side of FIG. 16, and a timing chart of changing the level of the shutter address selection signal SH_LAT_INF[$4n$] is illustrated on the lower side of FIG. 16.

Also, FIG. 16 illustrates signals in one horizontal scanning period. An XHS signal illustrated at the top represents an H synchronization signal.

The address selection signal ADD_INF[$4n$] is used in a time sharing manner, and thus becomes the H-level (effective) at any of timings in time-shared one horizontal scanning period.

A description will be given about the timing chart of changing the level of the read address selection signal RD_LAT_INF[$4n$]. By setting the control signal RLSET of the memory for read to the H-level while the address selection signal ADD_INF[$4n$] is at the H-level, the address selection signal ADD_INF[$4n$] is stored in the memory for read constituted by the NOR gates 83 and 84 of the control signal generating circuit 81, and the read address selection signal RD_LAT_INF[$4n$] decreases to the L-level.

After that, even if the address selection signal ADD_INF[$4n$] decreases to the L-level, the read address selection signal RD_LAT_INF[$4n$] can be output at the L-level because the address selection signal ADD_INF[$4n$] is stored in the memory for read constituted by the NOR gates 83 and 84. Then, in the next one horizontal scanning period, the control signal RLRST of the memory for read increases to the H-level, whereby the read address selection signal RD_LAT_INF[$4n$] is reset to the H-level.

Also, since the read address selection signal RD_LAT_INF[$4n$] is updated every horizontal scanning period, the control signal RLRST of the memory for read is supplied once per horizontal scanning period. Therefore, the timing to set the control signal RLRST of the memory for read to the H-level comes before the control signal RLSET of the memory for read is set to the H-level.

The read address selection signal RD_LAT_INF[$4n$] output from the control signal generating circuit 81 is a signal that changes by shifting from the start time of the horizontal scanning period. The amount of shift depends on the timing at which the control signal RLSET of the memory for read increases to the H-level.

Then, the read address selection signal RD_LAT_INF[$4n$] is supplied to the output control circuit $53_0$ as the control signal 1, that is, as the read address selection signal RD_ADD_INF[$4n$] in FIG. 13.

Also, as illustrated on the lower side of FIG. 16, the shutter address selection signal SH_LAT_INF[$4n$] changes in its level in accordance with the control signals SLRST and SLSET of the memory for shutter, like the read address selection signal RD_LAT_INF[4n]. Then, the shutter address selection signal SH_LAT_INF[4n] is supplied to the output control circuit $53_0$ as the shutter address selection signal SH_ADD_INF [4n] in FIG. 13.

In accordance with such timing charts, the control signal generating circuit 81 can generate the read address selection signal RD_LAT_INF[4n] and the shutter address selection signal SH_LAT_INF[4n].

Next, potentials at discharge of an unnecessary charge accumulated in the photodiode 31 in FIG. 2 will be described with reference to FIG. 17.

Figure 17:
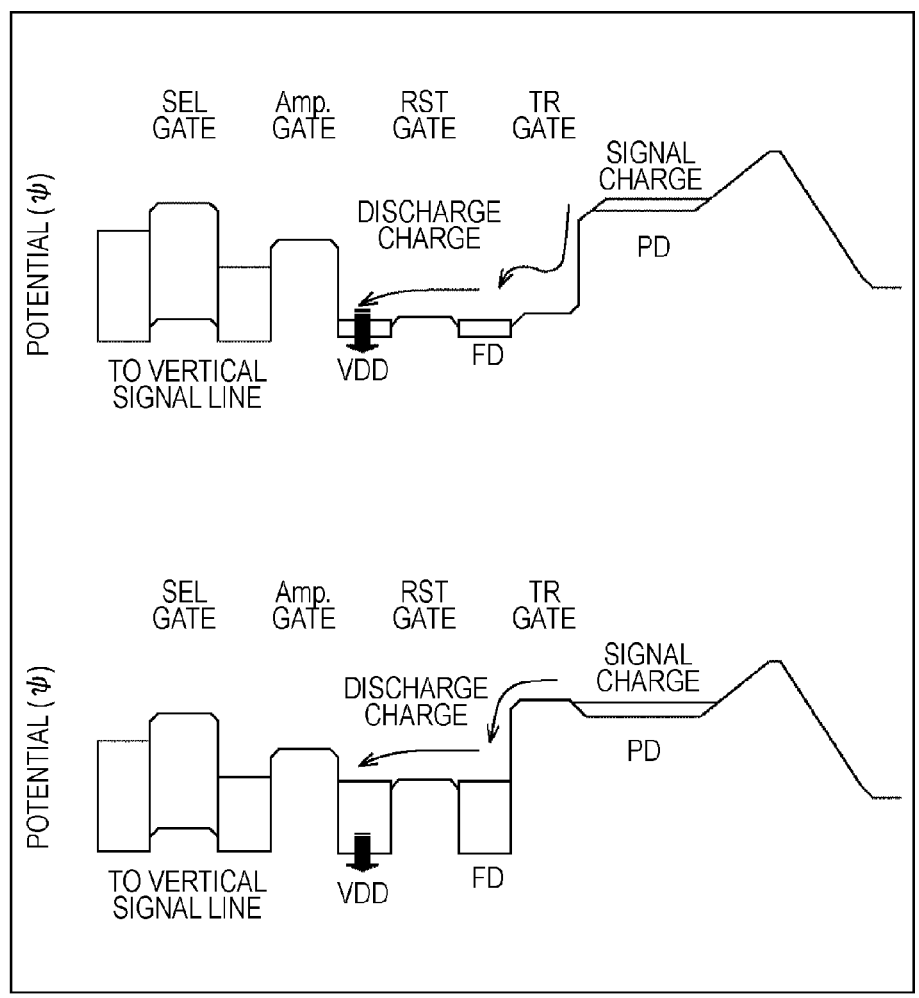
FIG. 17 explains potentials at discharge of an unnecessary charge accumulated in a photodiode 31.

In FIG. 17, potentials at a SEL gate, an Amp gate, an RST gate, and a TR gate are illustrated in the vertical direction. The potentials increase toward the upper side in the vertical direction.

The upper side of FIG. 17 illustrates a state where the RST gate and the TR gate are completely open, the state being caused by setting the drive signal TR_OUT supplied to the transfer transistor 32 to the H-level and setting the drive signal RST_OUT supplied to the reset transistor 33 to the H-level at discharge of a charge.

In such a state, a charge generated through photoelectric conversion performed by the photodiode (PD) 31 is transferred to the floating diffusion (FD) 36 via the TR gate, and is discharged to the power supply voltage VDD (unnecessary-charge drain portion) via the RST gate. At this time, the TR gate is completely open, and thus the charge is transferred to the floating diffusion 36 as soon as the charge is generated in the photodiode 31.

In this way, an unnecessary charge can be discharged. However, even if the TR gate and the RST gate are not completely opened, an unnecessary charge can be discharged to avoid the occurrence of the blooming phenomenon.

The lower side of FIG. 17 illustrates a state where the TR gate and the RST gate are partly open at discharge of a charge. That is, by causing the potentials of signals supplied to the transfer transistor 32 and the reset transistor 33 to be at an intermediate potential, the TR gate and the RST gate are partly opened.

By partly opening the TR gate, the charge generated through photoelectric conversion performed by the photodiode 31 is accumulated to some extent, but the charge overflowed from the photodiode 31 does not flow to a substrate side but flows to the floating diffusion 36 because the potential on the substrate side is high. Thus, as in the state illustrated on the upper side of FIG. 17, the charge overflowed from the photodiode 31 is discharged to the power supply voltage VDD via the RST gate.

Also, the charge accumulated in the photodiode 31 and the floating diffusion 36 when the TR gate and the RST gate are partly open is discharged due to a shutter process that is performed before a charge accumulation process according to an exposure time starts, and the charge accumulation process starts from a state where no charge is accumulated in the photodiode 31.

Additionally, even when only the TR gate is partly opened, the charge overflowed from the photodiode 31 flows to the floating diffusion 36 and is discharged to the power supply voltage VDD via the RST gate, as in the state where the TR gate and the RST gate are partly opened.

In this way, an unnecessary charge can be discharged even if the TR gate and the RST gate are not completely opened.

Note that the embodiments of the present invention are not limited to the above-described embodiments, and various changes can be accepted without deviating from the scope of the present invention.

The invention claimed is:

1. An image sensor configured to capture an image, comprising:
 a voltage source;
 a pixel including
  (a) a photoelectric conversion element configured to photoelectrically convert incident light into a charge,
  (b) a charge accumulation element,
  (c) a first switch between the photoelectric conversion element and the charge accumulation element, and
  (d) a second switch between the charge accumulation element and the voltage source; and
 a controller that causes the pixel to perform, in order,
  (i) a shutter process in which unnecessary charges accumulated in the pixel are discharged in a first period,
  (ii) a charge accumulation process in which charge generated in a predetermined exposure time in the pixel is accumulated in a second period,
  (iii) a read process in which a pixel signal is output in a third period, and
  (iv) a discharge process in which charge is not accumulated in the photoelectric conversion element in a fourth period, wherein,
 the first switch is caused to be in a conductive state throughout the fourth period, and
 the second switch is caused to be in a conductive state throughout each of the first, second, and fourth periods.

2. The image sensor of claim 1, wherein:
 the image sensor includes a plurality of the pixels arranged in a matrix with rows and columns and a plurality of the controllers, each controller being provided for each row of the pixels, and
 each controller controls its corresponding pixels based on a selection signal indicating whether the pixels in the row are selected to output pixel signals.

3. The image sensor of claim 1, wherein during the discharge process, the controller turns on both the first switch and the second switch so that charge generated by the photoelectric conversion element is transferred to the charge accumulation element and the charge in the charge accumulation element is discharged.

4. The image sensor of claim 1, wherein the controller turns on the second switch to discharge the charge when the shutter process and the charge accumulation process are being performed.

5. The image sensor of claim 3, wherein:
 the pixel includes a plurality of the photoelectric conversion elements and a respective plurality of the first switches,
 charges generated through photoelectric conversion by the photoelectric conversion elements are sequentially transferred to the charge accumulation element via the first switches, and
 when any one of the first switches of the respective photoelectric conversion elements is turned on, the controller is configured to turn off other ones of the first switches.

6. The image sensor of claim 1, wherein the controller includes a memory configured to store a selection signal indicating whether the pixel is selected to output a pixel signal.

* * * * *